US012713946B2

(12) United States Patent
Kang

(10) Patent No.: US 12,713,946 B2
(45) Date of Patent: Aug. 18, 2026

(54) SEMICONDUCTOR PACKAGES

(71) Applicant: SAMSUNG ELECTRONICS CO., LTD., Suwon-si (KR)

(72) Inventor: Junghoon Kang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 354 days.

(21) Appl. No.: 18/590,379

(22) Filed: Feb. 28, 2024

(65) Prior Publication Data

US 2025/0079320 A1 Mar. 6, 2025

(30) Foreign Application Priority Data

Aug. 30, 2023 (KR) ........................ 10-2023-0114396

(51) Int. Cl.

| | |
|---|---|
| ***H10W 70/60*** | (2026.01) |
| ***H10W 20/20*** | (2026.01) |
| ***H10W 70/63*** | (2026.01) |
| ***H10W 70/685*** | (2026.01) |
| ***H10W 74/10*** | (2026.01) |
| ***H10W 90/00*** | (2026.01) |
| ***H10W 90/22*** | (2026.01) |

(52) U.S. Cl.

CPC .......... *H10W 70/611* (2026.01); *H10W 20/20* (2026.01); *H10W 70/635* (2026.01); *H10W 70/685* (2026.01); *H10W 74/114* (2026.01); *H10W 74/121* (2026.01); *H10W 90/00* (2026.01); *H10W 90/401* (2026.01); *H10W 90/701* (2026.01); *H10W 90/22* (2026.01); *H10W 90/724* (2026.01); *H10W 90/794* (2026.01)

(58) Field of Classification Search

CPC ............. H10W 70/611; H10W 70/685; H10W 90/701; H10W 74/114; H10W 74/121

See application file for complete search history.

(56) References Cited

U.S. PATENT DOCUMENTS 9,373,605 B1 * 6/2016 Wang .................. H10W 70/685
9,496,211 B2 11/2016 Kulkarni et al.

(Continued)

*Primary Examiner* — Steven M Page

(74) *Attorney, Agent, or Firm* — Wolf, Greenfield & Sacks, P.C.

(57) ABSTRACT

A semiconductor package comprising: a first redistribution substrate; a module structure on the first redistribution substrate; a first molding layer on the first redistribution substrate and extending around the module structure; a second redistribution substrate on the module structure and the first molding layer; and a first vertical connection structure on a side of the module structure and electrically connecting the first redistribution substrate and the second redistribution substrate, wherein the module structure includes: a third redistribution substrate; a fourth redistribution substrate on the third redistribution substrate; a first semiconductor chip between the third redistribution substrate and the fourth redistribution substrate; a second molding layer between the third redistribution substrate and the fourth redistribution substrate and extending around the first semiconductor chip; and a second semiconductor chip on the fourth redistribution substrate, wherein the first semiconductor chip and the second semiconductor chip are electrically connected by the fourth redistribution substrate.

20 Claims, 19 Drawing Sheets

(56) References Cited

U.S. PATENT DOCUMENTS

| | | | | |
|---|---|---|---|---|
| 10,790,162 | B2 | 9/2020 | Tsai et al. | |
| 11,158,550 | B2 | 10/2021 | Oh | |
| 11,164,838 | B2 | 11/2021 | Lee et al. | |
| 11,257,797 | B2 | 2/2022 | Shen et al. | |
| 11,417,631 | B2 * | 8/2022 | Lee | H10W 70/614 |
| 11,574,868 | B2 | 2/2023 | Kim et al. | |
| 2020/0091077 | A1 | 3/2020 | Tsai et al. | |
| 2022/0352128 | A1 * | 11/2022 | Lee | H10W 20/023 |
| 2022/0415838 | A1 * | 12/2022 | Lee | H10W 70/09 |

* cited by examiner 30
900
920
920w
922
210
930
914
910
912
940
822
820
810
222
226
422
426
424
420
224
220
110
120
124
130
700
760
750
710
724
730
720
740
622
620
610
1
324
522
512
520
510
530
524
540
332
320
310
410

700
750
710
724
730
720
740
540
300
SL1
324
310
522
512
510
500
530
524
OP2
332
320
410
622
620
610
422
426
424
3000
600
420

700
750
710
724
730
720
740
540
300
SL1
MS
324
310
512
522
510
500
530
524
OP2
332
320
410
SL1
622
620
610
422
426
424
420

SEMICONDUCTOR PACKAGES

CROSS-REFERENCE TO RELATED APPLICATION

This U.S. nonprovisional application claims priority under 35 U.S.C. § 119 to Korean Patent Application No. 10-2023-0114396 filed on Aug. 30, 2023 in the Korean Intellectual Property Office, the disclosure of which is hereby incorporated by reference in its entirety.

BACKGROUND

The present inventive concepts relate to semiconductor packages and methods of fabricating the same, and more particularly, to semiconductor packages including a connection substrate and a method of fabricating the same.

A semiconductor package may be provided to implement an integrated circuit chip (e.g., a semiconductor chip) to be suitable for use in electronic products. With the recent development of electronic industry, the semiconductor package is variously developed to reach the goal of compact size, small weight, and/or low manufacturing cost. The size of a semiconductor chip becomes smaller with high integration of the semiconductor chip. It, however, may be difficult to adhere, handle, and test solder balls (for the semiconductor chip) due to the small size of the semiconductor chip. Additionally, it may cause problems of acquiring various mount boards in accordance with the size of the semiconductor chip. A fan-out panel-level package is proposed to solve the problems described above. In the case of the fan-out panel-level semiconductor package, the area of redistribution lines may be greater than that of the semiconductor chip. Accordingly, there is a problem in that the fan-out panel-level semiconductor package may occupy an excessively large area compared to the semiconductor chip (or the utility of the semiconductor chip).

SUMMARY

Some embodiments of the present inventive concepts provide semiconductor packages with improved electrical properties and methods of fabricating the same.

Some embodiments of the present inventive concepts provide semiconductor packages with increased structural stability and methods of fabricating the same.

Some embodiments of the present inventive concepts provide methods of fabricating semiconductor packages whose processes are simplified and costs are reduced and the semiconductor packages fabricated by the same.

According to some embodiments of the present inventive concepts, a semiconductor package may comprise: a first redistribution substrate; a module structure on the first redistribution substrate; a first molding layer on the first redistribution substrate, wherein the first molding layer extends around at least a portion of the module structure on the first redistribution substrate; a second redistribution substrate on the module structure and the first molding layer; and a first vertical connection structure on a side of the module structure, wherein the first vertical connection structure electrically connects the first redistribution substrate and the second redistribution substrate, wherein the module structure includes: a third redistribution substrate; a fourth redistribution substrate on the third redistribution substrate; a first semiconductor chip between the third redistribution substrate and the fourth redistribution substrate; a second molding layer between the third redistribution substrate and the fourth redistribution substrate, wherein the second molding layer extends around at least a portion of the first semiconductor chip; and a second semiconductor chip on the fourth redistribution substrate, wherein the first semiconductor chip and the second semiconductor chip are electrically connected by a wiring pattern in the fourth redistribution substrate.

According to some embodiments of the present inventive concepts, a semiconductor package may comprise: a first redistribution substrate; a second redistribution substrate on the first redistribution substrate; a first connection substrate between the first redistribution substrate and the second redistribution substrate, wherein a first opening extends into the first connection substrate; and a first package in the first opening between the first redistribution substrate and the second redistribution substrate, wherein the first package includes: a second package; a first semiconductor chip on the second package; and a first molding layer on the second package, wherein the first molding layer extends around at least a portion of the first semiconductor chip, wherein the second package includes: a third redistribution substrate; a fourth redistribution substrate on the third redistribution substrate; a second connection substrate between the third redistribution substrate and the fourth redistribution substrate, wherein a second opening extends into the second connection substrate; and a second semiconductor chip in the second opening between the third redistribution substrate and the fourth redistribution substrate, wherein a wiring pattern in the first redistribution substrate is directly connected to a wiring pattern in the third redistribution substrate.

According to some embodiments of the present inventive concepts, a semiconductor package may comprise: a first redistribution substrate; a first connection substrate on the first redistribution substrate, wherein an opening extends into the first connection substrate; a module structure in the opening on the first redistribution substrate; a molding layer on the first redistribution substrate, wherein the molding layer is on the module structure and the first connection substrate and is between the module structure and the first connection substrate; a plurality of external connections on a lower surface of the first redistribution substrate; a second redistribution substrate on the molding layer, wherein the second redistribution substrate is electrically connected to the first connection substrate; and an upper package on the second redistribution substrate, wherein the module structure includes: a third redistribution substrate; a first semiconductor chip on the third redistribution substrate; a fourth redistribution substrate on the first semiconductor chip; a second connection substrate on a side of the first semiconductor chip, wherein the second connection substrate electrically connects the third redistribution substrate to the fourth redistribution substrate; and a second semiconductor chip on the fourth redistribution substrate, wherein a wiring pattern in the fourth redistribution substrate is electrically connected to first pads on an upper surface of the second connection substrate and to second pads on an upper surface of the first semiconductor chip, and wherein a wiring pattern in the third redistribution substrate is electrically connected to third pads on a lower surface of the second connection substrate and to fourth pads on a lower surface of the first semiconductor chip.

DETAILED DESCRIPTION

It will be hereinafter described semiconductor packages according to the present inventive concepts with reference to accompanying drawings.

Figure 1:
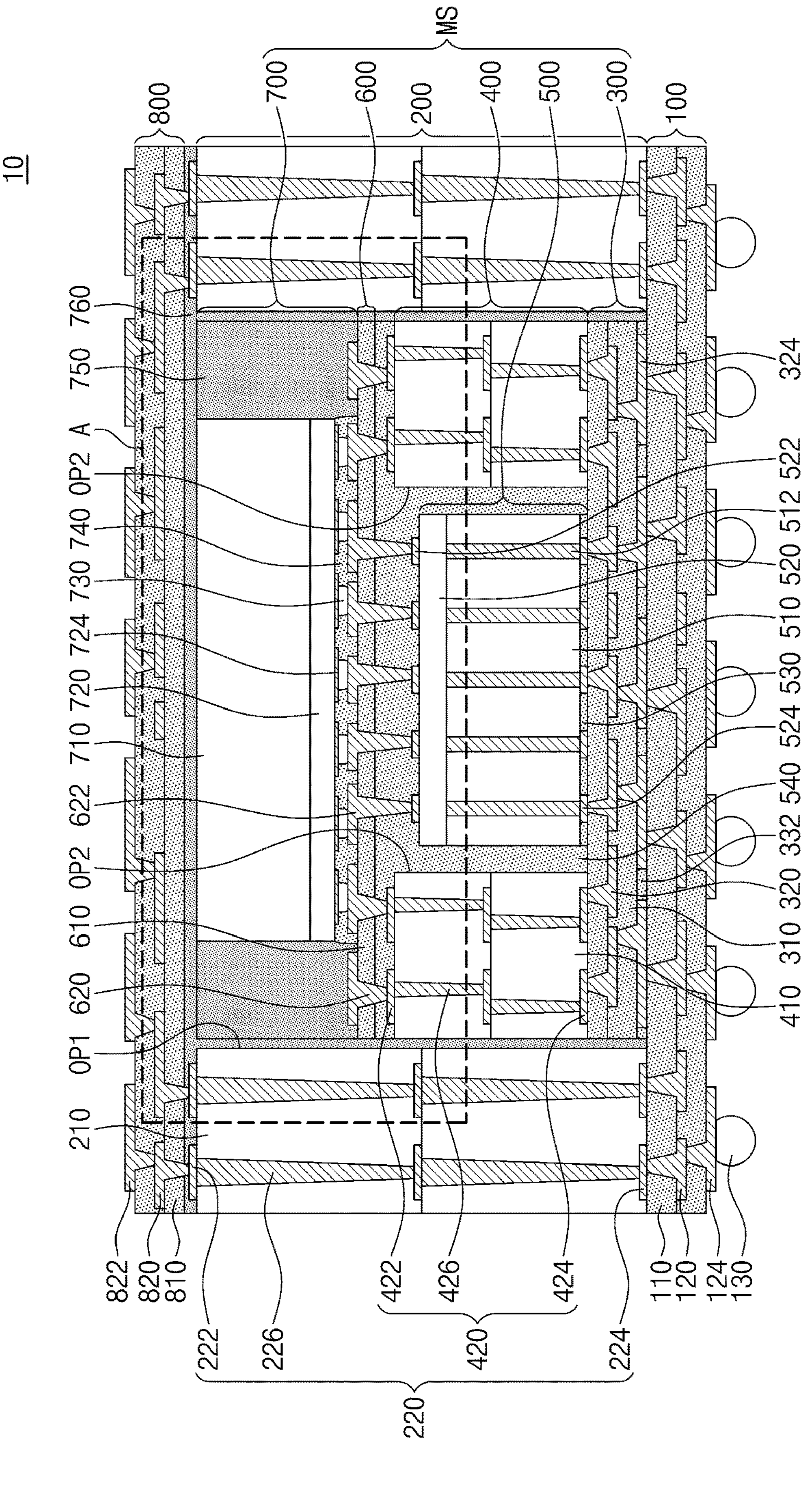
FIG. 1 illustrates a cross-sectional view showing a semiconductor package according to some embodiments of the present inventive concepts.

FIG. 1 illustrates a cross-sectional view showing a semiconductor package according to some embodiments of the present inventive concepts.

Figure 2:
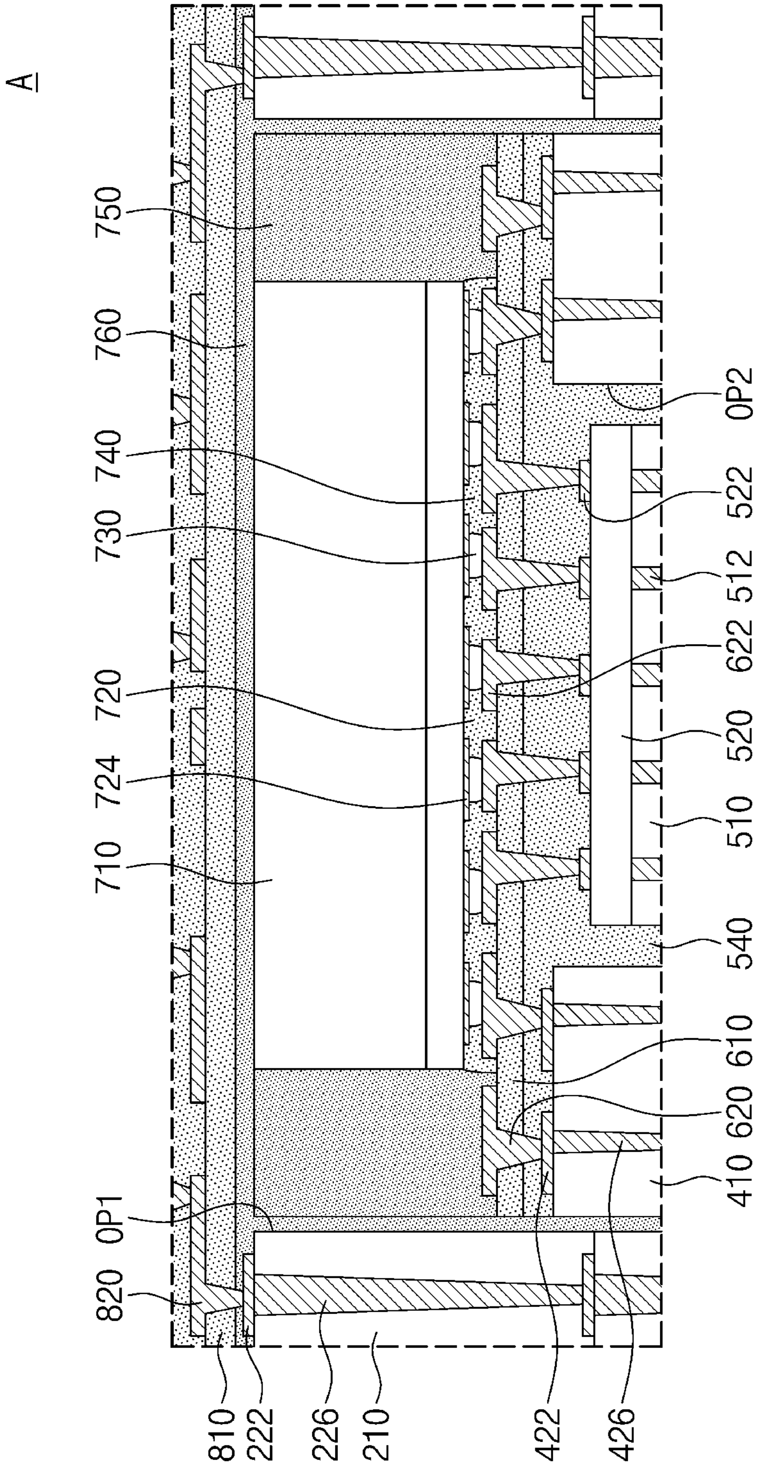
FIGS. 2 to 4 illustrate enlarged views showing section A of FIG. 1.
Figure 3:
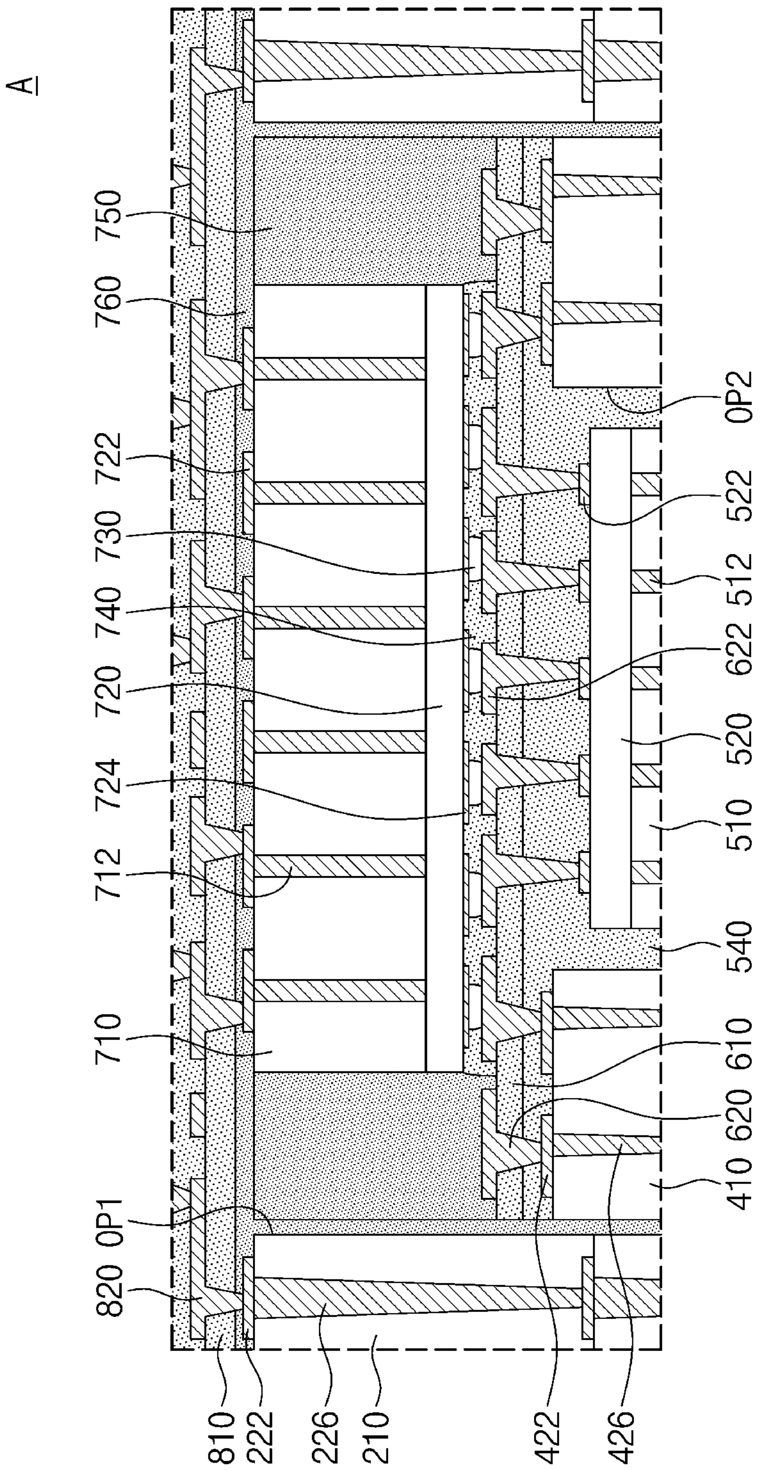
Figure 4:
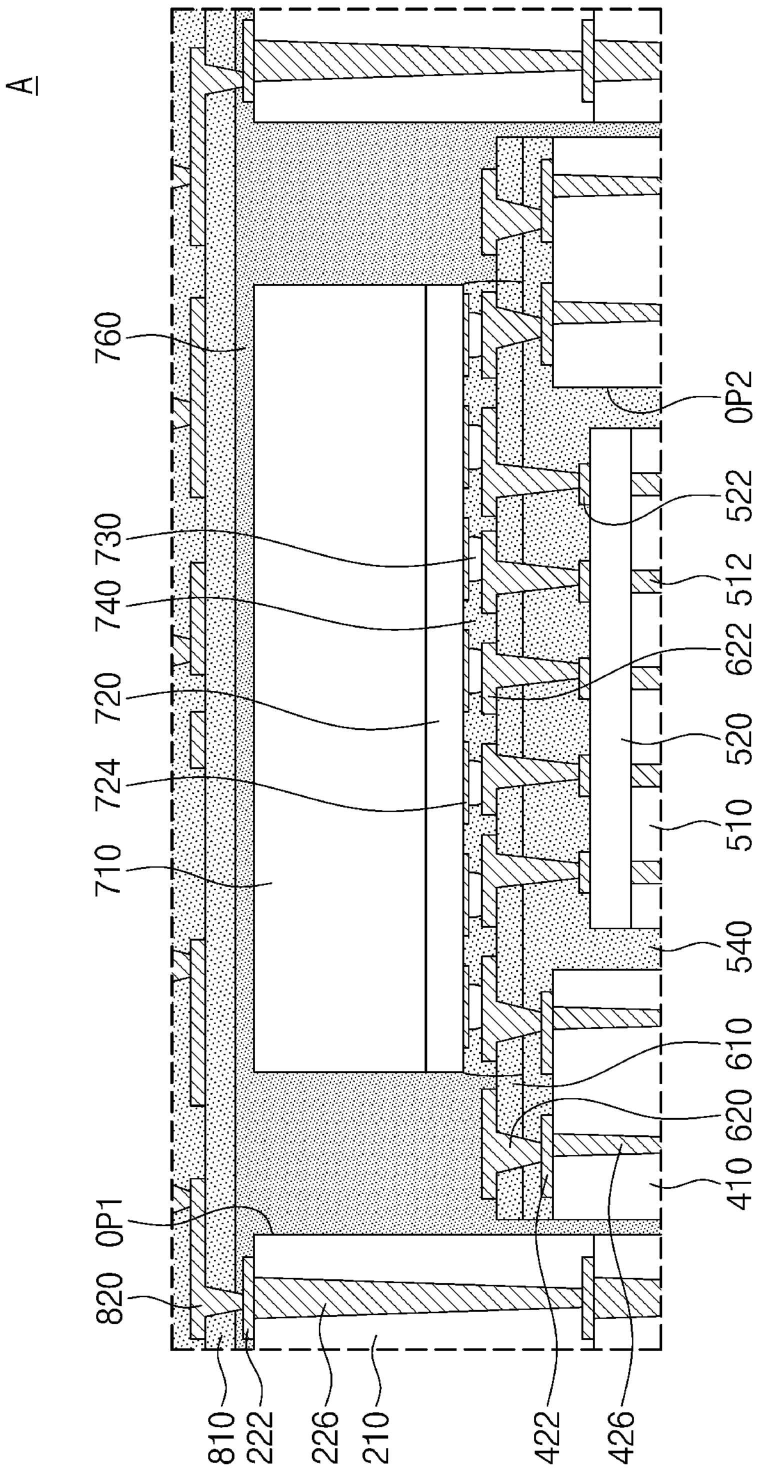
Figure 5:
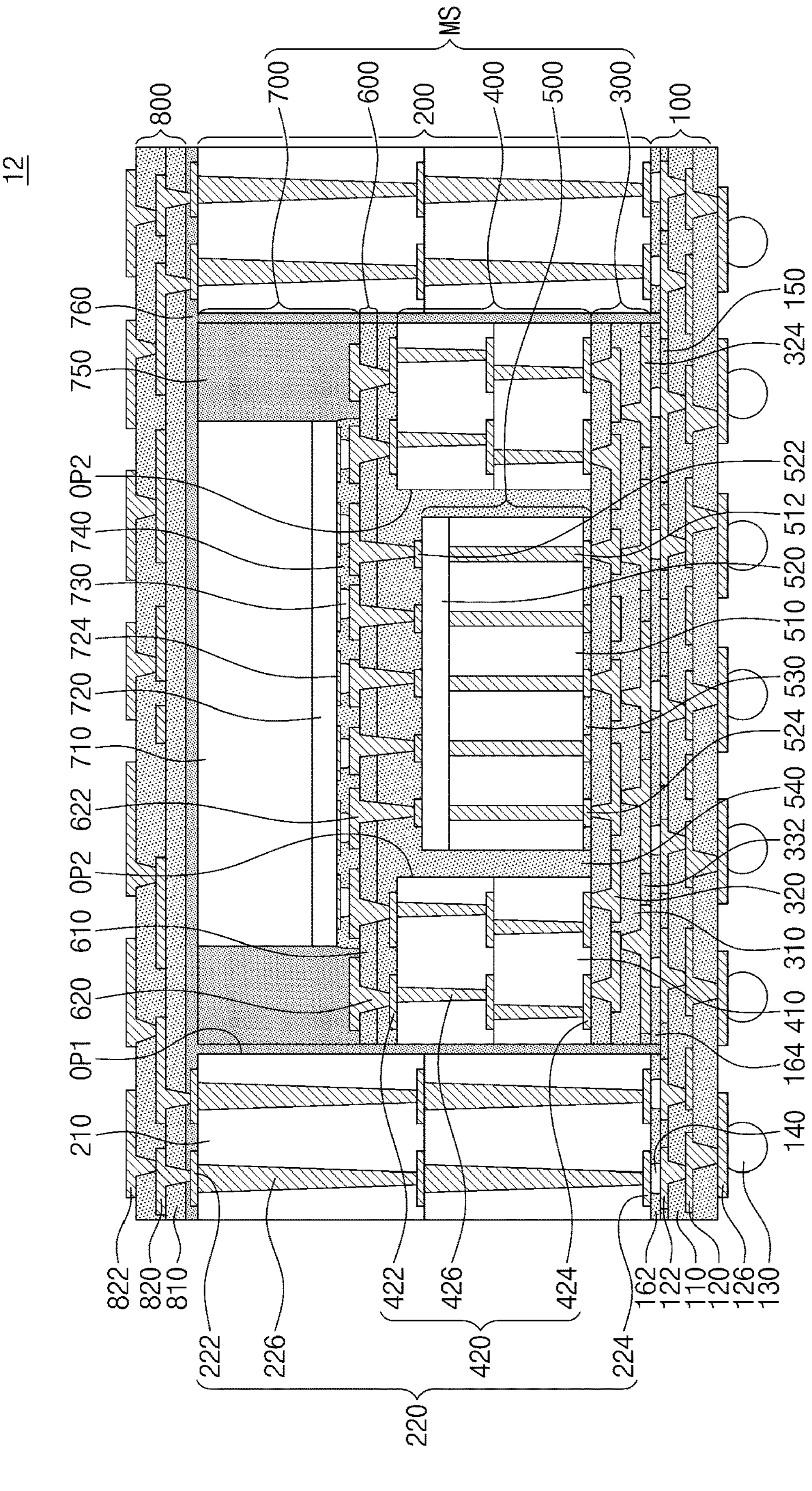
FIGS. 5 to 8 illustrate cross-sectional views showing a semiconductor package according to some embodiments of the present inventive concepts.

FIGS. 2 to 4 illustrate enlarged views of section A depicted in FIG. 1. FIG. 5 illustrates a cross-sectional view showing a semiconductor package according to some embodiments of the present inventive concepts.

Referring to FIGS. 1 and 2, a first redistribution substrate 100 may be provided on a lower surface of a semiconductor package 10. In some embodiments, a lower surface of the first redistribution substrate 100 may be the lower surface of the semiconductor package 10. As used herein, the term "lower" may also mean "lowermost" or "bottom". Similarly, the term "upper" may also mean "uppermost" or "top". For example, a "lower surface" may refer to the "bottom surface", and an "upper surface" may refer to the "top surface". The first redistribution substrate 100 may include one first substrate wiring layer or at least two stacked first substrate wiring layers. Each of the first substrate wiring layers may include a first substrate dielectric pattern 110 and a first substrate wiring pattern 120 in the first substrate dielectric pattern 110. The first substrate wiring pattern 120 in one first substrate wiring layer may be electrically connected to the first substrate wiring pattern 120 of another (e.g., an adjacent another) first substrate wiring layer. It will be understood that when an element or layer is referred to as being "connected to", or "coupled to" another element or layer, it may be directly on, connected to, or coupled to the other element or layer, or one or more intervening elements or layers may be present. In contrast, when an element is referred to as being "directly coupled," "directly connected," or "directly responsive" to, or "directly on," another element, there are no intervening elements present. In addition, "electrical connection" conceptually includes a physical connection and a physical disconnection. In addition, it will also be understood that when an element or layer is referred to as being "between" two elements or layers, it may be the only element or layer between the two elements or layers, or one or more intervening elements or layers may also be present. As used herein, the term "and/or" includes any and all combinations of one or more of the associated listed items. Spatially relative terms, such as "beneath," "below," "lower," "under," "above," "upper," and the like, may be used herein for ease of explanation to illustrate one element or feature's relationship to another element or feature as illustrated in the figures. It will be understood that the spatially relative terms are intended to encompass different orientations of the device in use or in operation, in addition to the orientation depicted in the figures. For example, when the device in the drawings may be turned over, elements described as "below" or "beneath" or "under" other elements or features would then be oriented "above" the other elements or features. Thus, the example terms "below" and "under" may encompass both an orientation of above and below. The device may be otherwise oriented, for example, rotated 90 degrees or at other orientations, and the spatially relative descriptors used herein should be interpreted accordingly.

The first substrate dielectric pattern 110 may include, for example, a polymer. For example, the first substrate dielectric pattern 110 may include a dielectric polymer or a photo-imageable dielectric (PID). The photo-imageable dielectric may include, for example, photosensitive polyimide, polybenzoxazole, phenolic polymers, and/or benzocyclobutene polymers. In some embodiments, the first substrate dielectric pattern 110 may include, for example, a dielectric material, such as silicon oxide (SiO), silicon nitride (SiN), and/or silicon oxynitride (SiON).

The first substrate wiring pattern 120 may be provided on a lower surface of the first substrate dielectric pattern 110. The first substrate wiring pattern 120 may horizontally extend on the lower surface of the first substrate dielectric pattern 110. For example, the first substrate wiring pattern 120 may extend parallel with the lower surface of the first substrate dielectric pattern 110. The first substrate wiring pattern 120 may protrude from the lower surface of the first substrate dielectric pattern 110. Below the first substrate dielectric pattern 110, the first substrate wiring pattern 120 may be covered (or overlapped in a direction perpendicular to the lower surface of the first substrate dielectric pattern 110) with an (another) underlying first substrate dielectric pattern 110. As used herein, "an element A overlapping an element B in a direction C" (or similar language) means that there is at least one line that extends in the direction C and intersects both the elements A and B. The first substrate wiring pattern 120 in a lowermost first substrate wiring layer may be referred to as first pads 124. For example, the first pads 124 may be on a lower surface of the first substrate dielectric pattern 110 of the lowermost first substrate wiring layer. The first pads 124 may be connected (e.g., electrically connected) and/or coupled to external terminals 130 which will be discussed below. As discussed above, the first substrate wiring pattern 120 may include a pad and/or a line part of the first substrate wiring layer. For example, the first substrate wiring pattern 120 may include a component for horizontal redistribution in the first redistribution substrate 100. The first substrate wiring pattern 120 may include, for example, a conductive material, such as copper (Cu).

The first substrate wiring pattern 120 may have a damascene structure. For example, the first substrate wiring pattern 120 may have a via that protrudes from an upper surface thereof. The via may vertically connect (e.g., electrically connect) the first substrate wiring patterns 120 of (two) neighboring (e.g., adjacent) first substrate wiring layers. In some embodiments, a vertical direction may refer to a direction perpendicular to the lower or upper surface of the first substrate dielectric pattern 110. For example, the via may extend in (e.g., penetrate) the first substrate dielectric pattern 110 to be connected (e.g., electrically connected) and/or coupled to a lower surface of the first substrate wiring pattern 120 of an another overlying first substrate wiring layer. In some embodiments, the via may connect (e.g., electrically connect) the first substrate wiring pattern 120 of an uppermost first substrate wiring layer to a first connection substrate 200 and/or a module structure MS which will be discussed below. For example, the via may extend in (e.g., penetrate) an uppermost first substrate dielectric pattern 110 to be connected (e.g., electrically connected) and/or coupled to a first connection substrate 200 and/or a module structure MS which will be discussed. In this configuration, a lower portion of the first substrate wiring pattern 120 positioned on/at the lower surface of the first substrate dielectric pattern 110 may be referred to as a head part used as a horizontal line or pad, and the via of the first substrate wiring pattern 120 may be referred to as a tail part (used as a vertical connection). For example, the first substrate wiring pattern 120 may have an inverse T shape (referring to FIG. 1).

The first pads 124 may be provided with external terminals 130 on lower surfaces thereof. For example, the external terminals 130 may be on the lower surfaces of the first pads 124. The external terminals 130 may include, for example, solder balls and/or solder bumps. Based on a type and arrangement of the external terminals 130, a semiconductor package may be provided in the form of a ball grid array (BGA), a fine ball grid array (FBGA), or a land grid array (LGA).

A first connection substrate 200 may be provided on (an upper surface of) the first redistribution substrate 100. A first opening OP1 may be disposed in the first connection substrate 200. The first opening OP1 may extend in (e.g., penetrates) the first connection substrate 200. For example, the first opening OP1 may have an open hole shape that connects an upper and a lower surfaces of the first connection substrate 200. For example, the first opening OP1 may expose a portion of the upper surface of the first redistribution substrate 100. The first opening OP1 may be defined to indicate a space where a module structure MS is provided, which will be discussed below. A lower surface of the first connection substrate 200 may be in contact with the upper surface of the first redistribution substrate 100.

The first connection substrate 200 may include a first base layer 210 and a first conductive member 220 provided in the first base layer 210. The first conductive member 220 may be a wiring structure that vertically connects (e.g., electrically connects) the first redistribution substrate 100 to a fourth redistribution substrate 800, which will be discussed below. For example, the first connection substrate 200 may be a vertical connection structure that connects (e.g., electrically connects) the first redistribution substrate 100 to the fourth redistribution substrate 800. The first conductive member 220 may be disposed between the first opening OP1 and an outer side (outer lateral) surface of the first connection substrate 200. For example, the first conductive member 220 may be adjacent the first opening OP1. The first conductive member 220 may include first upper pads 222, first lower pads 224, and first vias 226.

The first upper pads 222 may be disposed on the upper surface of the first connection substrate 200. The first upper pads 222 may protrude from the upper surface of the first connection substrate 200. In some embodiments, the first upper pads 222 may be buried in the first base layer 210, and upper surfaces of the first upper pads 222 may be coplanar with the upper surface of the first connection substrate 200. The first lower pads 224 may be disposed on the lower surface of the first connection substrate 200. The first lower pads 224 may be buried in the first base layer 210, and lower surfaces of the first lower pads 224 may be coplanar with the lower surface of the first connection substrate 200. The first vias 226 may extend in (e.g., penetrate) the first base layer 210 to electrically connect the first upper pads 222 to the first lower pads 224. The first base layer 210 may include, for example, a polymer. For example, the first base layer 210 may include a dielectric polymer and/or a photo-imageable dielectric (PID). The photo-imageable dielectric may include, for example, photosensitive polyimide, polybenzoxazole, phenolic polymers, and/or benzocyclobutene polymers. In some embodiments, the first base layer 210 may include, for example, a dielectric material. The first base layer 210 may include, for example, silicon oxide (SiO), silicon nitride (SiN), and/or silicon oxynitride (SiON). In some embodiments, the first base layer 210 may include a prepreg. The first upper pads 222, the first lower pads 224, and the first vias 226 may include a conductor and/or metal such as copper (Cu).

FIG. 1 depicts that the first base layer 210 is separated into two layers, but the present inventive concepts are not limited thereto. The first base layer 210 may be separated into more than two layers (e.g., three or four layers). In this case, the first vias 226 may have a reduced aspect ratio.

The first connection substrate 200 may be (mounted) on the first redistribution substrate 100. For example, the first connection substrate 200 may be in contact with the first redistribution substrate 100. The first substrate wiring pattern 120 of the uppermost first substrate wiring layer may extend in (e.g., penetrate) the first substrate dielectric pattern 110 (of the uppermost first substrate wiring layer) to be connected (e.g., electrically connected) and/or coupled to the first lower pads 224. Therefore, the first connection substrate 200 may be electrically connected to the external terminals 130 and a module structure MS which will be discussed below.

A module structure MS may be disposed on (the upper surface of) the first redistribution substrate 100. The module structure MS may be disposed in the first opening OP1 in the first connection substrate 200. In this case, the module structure MS may be disposed on the first redistribution substrate 100 exposed by first the opening OP1. The module structure MS may be in contact with the upper surface of the first redistribution substrate 100. The module structure MS may be spaced apart from the first connection substrate 200. For example, the module structure MS may be spaced apart from an inner side (inner lateral) surface of the first opening OP1. An upper surface of the module structure MS may be located at a level from the first redistribution substrate 100 the same as a level of the upper surface of the first connection substrate 200 (from the first redistribution substrate 100). For example, the module structure MS may have a same height as that of the first connection substrate 200. Herein, the terms "level" or "height" may refer to a distance in the vertical direction from (the upper or lower surface) the first redistribution substrate 100. For example, when an element A is described as lower than an element B, the element A may be closer than the element B to the upper/lower surface of the first redistribution substrate 100 in the vertical direction.

For example, in some embodiments, the upper surface of the module structure MS may be located at a level from the first redistribution substrate 100 higher or lower than a level of the upper surface of the first connection substrate 200. For example, the module structure MS may have a height greater or less than that of the first connection substrate 200. A configuration of the module structure MS will be discussed in detail below.

The module structure MS may include (or constitute) one semiconductor package. The module structure MS may include a second redistribution substrate 300, a second connection substrate 400, a first semiconductor chip 500, a third redistribution substrate 600, and a second semiconductor chip 700.

The second redistribution substrate 300 may be provided. The second redistribution substrate 300 may be substantially similar to the first redistribution substrate 100 discussed above. The second redistribution substrate 300 may include one second substrate wiring layer or at least two stacked second substrate wiring layers. Each of the second substrate wiring layers may include a second substrate dielectric pattern 310 and a second substrate wiring pattern 320 in the second substrate dielectric pattern 310. In this case, the second substrate wiring pattern 320 of a lowermost second substrate wiring layer may be referred to as second pads 324. The second pads 324 may be connected (e.g., electrically connected) and/or coupled to the first substrate wiring pattern 120 of the uppermost first substrate wiring layer.

The second substrate wiring pattern 320 may have a damascene structure. For example, the second substrate wiring pattern 320 may have a via that protrudes from an upper surface thereof. The via may vertically connect (e.g., electrically connect) the second substrate wiring patterns 320 of (two) neighboring (e.g., adjacent) second substrate wiring layers. The via may connect (e.g., electrically connect) the second substrate wiring pattern 320 of an uppermost second substrate wiring layer to a second connection substrate 400 and/or a first semiconductor chip 500 which will be discussed below. For example, the via may extend in (e.g., penetrate) an uppermost second substrate dielectric pattern 310 to be connected (e.g., electrically connected) and/or coupled to the second connection substrate 400 and/or the first semiconductor chip 500. In this configuration, a lower portion of the second substrate wiring pattern 320 positioned on a lower surface of the second substrate dielectric pattern 310 may be referred to as a head part used as a horizontal line or pad, and the via of the second substrate wiring pattern 320 may be referred to as a tail part (used as a vertical connection). For example, the second substrate wiring pattern 320 may have an inverse T shape (referring to FIG. 1).

A first substrate protection layer 332 may be provided on a lower surface of the second redistribution substrate 300. In some embodiments, the first substrate protection layer 332 may be disposed in the second redistribution substrate 300. The first substrate protection layer 332 may cover (or overlap) a lower surface of the lowermost second substrate wiring layer. In some embodiments, the lower surface of the first substrate protection layer 332 may be coplanar with the lower surface of the lowermost second substrate wiring layer and may expose lower surfaces of the second pads 324. In some embodiments, the first substrate protection layer 332 may be omitted. The first substrate protection layer 332 may include, for example, a dielectric polymer or a photo-imageable dielectric (PID).

In some embodiments, the second connection substrate 400 may be provided on (an upper surface of) the second redistribution substrate 300. A second opening OP2 may be disposed in the second connection substrate 400. The second opening OP2 may extend in (e.g., penetrate) the second connection substrate 400. For example, the second opening OP2 may have an open hole shape that connects an upper and a lower surfaces of the second connection substrate 400. For example, the second opening OP2 may expose a portion of the upper surface of the second redistribution substrate 300. The second opening OP2 may be defined to indicate a space where a first semiconductor chip 500 is provided, which will be discussed below. A lower surface of the second connection substrate 400 may be in contact with the upper surface of the second redistribution substrate 300.

The second connection substrate 400 may include a second base layer 410 and a second conductive member 420 provided in the second base layer 410. The second conductive member 420 may be substantially similar to the first conductive member 220 discussed above. The second conductive member 420 may be a wiring structure that vertically connects (e.g., electrically connects) the second redistribution substrate 300 to a third redistribution substrate 600 which will be discussed below. For example, the second connection substrate 400 may be a vertical connection structure that connects (e.g., electrically connects) the second redistribution substrate 300 and the third redistribution substrate 600. The second conductive member 420 may be disposed between the second opening OP2 and an outer side (outer lateral) surface of the second connection substrate 400. For example, the second conductive member 420 may be adjacent the second opening OP2. The second conductive member 420 may include second upper pads 422, second lower pads 424, and second vias 426.

The second upper pads 422 may be disposed on an upper surface of the second base layer 410. The second upper pads 422 may protrude from the upper surface of the second base layer 410. In some embodiments, the second upper pads 422 may be buried in an uppermost second base layer 410, and upper surfaces of the second upper pads 422 in the uppermost second base layer 410 may be coplanar with the upper surface of the second connection substrate 400. The second lower pads 424 may be disposed on the lower surface of the second connection substrate 400. The second lower pads 424 may be buried in a lowermost second base layer 410, and lower surfaces of the second lower pads 424 may be coplanar with the lower surface of the second connection substrate 400. The second vias 426 may extend in (e.g., penetrate) the second base layer 410 to electrically connect the second upper pads 422 to the second lower pads 424.

FIG. 1 depicts that the second base layer 410 is separated into two layers, but the present inventive concepts are not limited thereto. The second base layer 410 may be separated into more than two layers (e.g., three or four layers). In this case, the second vias 426 may have a reduced aspect ratio.

A first semiconductor chip 500 may be disposed on (the upper surface of) the second redistribution substrate 300. The first semiconductor chip 500 may be disposed in the second opening OP2 in the second connection substrate 400. In this case, the first semiconductor chip 500 may be disposed on the second redistribution substrate 300 exposed by the second opening OP2. The first semiconductor chip 500 may be in contact with the upper surface of the second redistribution substrate 300. The first semiconductor chip 500 may be spaced apart from the second connection substrate 400, for example, from an inner side (inner lateral) surface of the second opening OP2. An upper surface of the first semiconductor chip 500 may be located at a level from the second redistribution substrate 300 lower than a level of the upper surface of the second connection substrate 400 (from the second redistribution substrate 300). For example, the first semiconductor chip 500 may have a height less than that of the second connection substrate 400. In some embodiments, the upper surface of the first semiconductor chip 500 may be located at a level from the second redistribution substrate 300 the same as or higher than the level of the upper surface of the second connection substrate 400 (from the second redistribution substrate 300). In this configuration, the height of the first semiconductor chip 500 may be the same as or greater than that of the second connection substrate 400.

The first semiconductor chip 500 may be a logic chip. In some embodiments, the first semiconductor chip 500 may be a memory chip, such as DRAM, SRAM, MRAM, or Flash memory. The first semiconductor chip 500 may have a front surface and a rear surface. In this description, the term "front surface" may be defined to indicate a surface on an active surface side of an integrated device in a semiconductor chip, and the term "rear surface" may be defined to indicate a surface opposite to the front surface. The first semiconductor chip 500 may be face-up disposed on the second redistribution substrate 300. For example, the rear surface of the first semiconductor chip 500 may face the second redistribution substrate 300. For example, a lower surface of the first semiconductor chip 500 may be the rear surface of the first semiconductor chip 500, and the upper surface of the first semiconductor chip 500 may be the front surface of the first semiconductor chip 500. The first semiconductor chip 500 may include a first semiconductor substrate 510, a first circuit layer 520 provided on an upper surface of the first semiconductor substrate 510, and first through vias 512 that vertically penetrate the first semiconductor substrate 510.

The first through vias 512 may vertically extend in (e.g., penetrate) the first semiconductor substrate 510. The first through vias 512 may extend toward the upper surface of the first semiconductor chip 500 to come into connection (e.g., electrical connection) with the first circuit layer 520. The first through vias 512 may extend toward the lower surface of the first semiconductor chip 500 to come into connection (e.g., electrical connection) with second chip pads 524. The second chip pads 524 may be provided on the lower surface of the first semiconductor chip 500. The first circuit layer 520 may be provided with first chip pads 522 on an upper surface thereof. Although not shown, the first chip pads 522 may be electrically connected to a first circuit pattern of the first circuit layer 520. The first and second chip pads 522 and 524 may include a conductive material, such as copper (Cu).

The first semiconductor substrate 510 may be provided on its bottom surface with a dielectric layer 530 that surrounds the second chip pads 524. The dielectric layer 530 may cover the bottom surface of the first semiconductor substrate 510 and may expose bottom surfaces of the second chip pads 524. The dielectric layer 530 may include a dielectric material, such as silicon oxide (SiO), silicon nitride (SiN), or silicon oxynitride (SiON).

The second connection substrate 400 and the first semiconductor chip 500 may be (mounted) on the second redistribution substrate 300. For example, the second connection substrate 400 and the first semiconductor chip 500 may be in contact with the second redistribution substrate 300. The second substrate wiring pattern 320 of the uppermost second substrate wiring layer may extend in (e.g., penetrate) the uppermost second substrate dielectric pattern 310 to be connected (e.g., electrically connected) or coupled to the second lower pads 424 and the second chip pads 524. Therefore, the second connection substrate 400 may be electrically connected through the second substrate wiring pattern 320 to the first semiconductor chip 500.

According to some embodiments, as the second lower pads 424 on/at the lower surface of the second connection substrate 400 and the second chip pads 524 on/at the lower surface of the first semiconductor chip 500 may be in direct contact with the second substrate wiring pattern 320 of the second redistribution substrate 300, no solder ball or the likes may be provided between the second connection substrate 400 and the second redistribution substrate 300 and between the first semiconductor chip 500 and the second redistribution substrate 300. Therefore, the module structure MS and the semiconductor package 10 may become smaller in size. Accordingly, the semiconductor package 10 may improve (e.g., increase) in structural stability.

A first molding layer 540 may be provided on the second redistribution substrate 300. On the second redistribution substrate 300, the first molding layer 540 may extend around (e.g., cover or overlap) the second connection substrate 400 and the first semiconductor chip 500. In the second opening OP2 of the second connection substrate 400, the first molding layer 540 may at least partially fill a space between the second connection substrate 400 and the first semiconductor chip 500. The first molding layer 540 may cover or overlap the upper surface of the second connection substrate 400 and the upper surface of the first semiconductor chip 500. The first molding layer 540 may include, for example, a dielectric polymer material. For example, the first molding layer 540 may include an epoxy molding compound (EMC). In some embodiments, the first molding layer 540 may include an epoxy dielectric film. For example, the first molding layer 540 may include an Ajinomoto build-up film (ABF).

The third redistribution substrate 600 may be provided on the first molding layer 540. The third redistribution substrate 600 may include a third substrate wiring layer. The third substrate wiring layer may include a third substrate dielectric pattern 610 and a third substrate wiring pattern 620 in the third substrate dielectric pattern 610.

The third substrate dielectric pattern 610 may include, for example, a dielectric polymer and/or a photo-imageable dielectric (PID). The photo-imageable dielectric may include, for example photosensitive polyimide, polybenzoxazole, phenolic polymers, and/or benzocyclobutene polymers. The third substrate dielectric pattern 610 may include, for example, a dielectric material. For example, the third substrate dielectric pattern 610 may include silicon oxide (SiO), silicon nitride (SiN), or silicon oxynitride (SiON).

The third substrate wiring pattern 620 may be provided on an upper surface of the third substrate dielectric pattern 610. The third substrate wiring pattern 620 may horizontally extend on the upper surface of the third substrate dielectric pattern 610. The third substrate wiring pattern 620 may protrude from the upper surface of the third substrate dielectric pattern 610. The third substrate wiring pattern 620 may be third pads 622 to which first connection terminals 730 are coupled which will be discussed below. The third substrate wiring pattern 620 may be a pad or line part of the third substrate wiring layer. For example, the third substrate wiring pattern 620 may include a component for horizontal redistribution in the third redistribution substrate 600. The third substrate wiring pattern 620 may include a conductive material, such as copper (Cu).

The third substrate wiring pattern 620 may have a damascene structure. For example, the third substrate wiring pattern 620 may have a via that protrudes from a lower surface thereof. The via may be a component of the third substrate wiring pattern 620 for connection with the first semiconductor chip 500 and/or the second connection substrate 400. For example, the via may extend in (e.g., penetrate) the third substrate dielectric pattern 610 to be connected (e.g., electrically connected) or coupled to the second upper pads 422 and/or the first chip pads 522. Thus, the second connection substrate 400 and the first semiconductor chip 500 may be electrically connected through the third substrate wiring pattern 620. In this configuration, an upper portion of the third substrate wiring pattern 620 positioned on/at the upper surface of the third substrate dielectric pattern 610 may be referred to as a head part used as a horizontal line or pad, and the via of the third substrate wiring pattern 620 may be referred to as a tail part (used as a vertical connection). The third substrate wiring pattern 620 may have a T shape (referring to FIG. 1).

FIG. 1 depicts that the third redistribution substrate 600 includes one third substrate wiring layer, but the present inventive concepts are not limited thereto. The third redistribution substrate 600 may include at least two stacked third substrate wiring layers. In this case, the third pads 622 may be the third substrate wiring pattern 620 provided in an uppermost third substrate wiring layer. In some embodiments, the third pads 622 may be on an upper surface of the uppermost third substrate wiring layer. In addition, the via connected to the first semiconductor chip 500 and/or the second connection substrate 400 may be the third substrate wiring pattern 620 provided in a lowermost third substrate wiring layer. For example, the third substrate wiring pattern 620 may be on a lower surface of the lowermost third substrate wiring layer.

A second semiconductor chip 700 may be provided on the third redistribution substrate 600. The second semiconductor chip 700 may be a logic chip. In some embodiments, the second semiconductor chip 700 may be a memory chip, such as DRAM, SRAM, MRAM, or Flash memory. A width of the second semiconductor chip 700 (in a horizontal direction parallel with the upper/lower surface of the first substrate dielectric pattern 110) may be greater than that of the first semiconductor chip 500. In some embodiments, the area of the second semiconductor chip 700 may be greater than that of the first semiconductor chip 500. The second semiconductor chip 700 may have a front surface and a rear surface. The second semiconductor chip 700 may be face-down disposed on the third redistribution substrate 600. The front surface of the second semiconductor chip 700 may face the third redistribution substrate 600. For example, a lower surface of the second semiconductor chip 700 may be the front surface of the second semiconductor chip 700, and an upper surface of the second semiconductor chip 700 may be the rear surface of the second semiconductor chip 700. The second semiconductor chip 700 may include a second semiconductor substrate 710 and a second circuit layer 720 provided on a lower surface of the second semiconductor substrate 710.

The second circuit layer 720 may be provided with third chip pads 724 on a lower surface thereof. The third chip pads 724 may be on/at the lower surface of the second circuit layer 720. Although not shown, the third chip pads 724 may be electrically connected to a second circuit pattern in the second circuit layer 720. The third chip pads 724 may include a conductive material, such as copper (Cu).

According to some embodiments, the second semiconductor chip 700 may further include second through vias 712 that extend in (e.g., penetrate) the second semiconductor substrate 710. As illustrated in FIG. 3, the second through vias 712 may extend toward the lower surface of the second semiconductor chip 700 to come into connection (e.g., electrical connection) with the second circuit layer 720. The second through vias 712 may extend toward the upper surface of the second semiconductor chip 700 to come into connection (e.g., electrical connection) with fourth chip pads 722. The fourth chip pads 722 may be provided on/at the upper surface of the second semiconductor chip 700. The fourth chip pads 722 may include a conductive material, such as copper (Cu). The following description will be continuously disclosed with reference to FIGS. 1 and 2.

The second semiconductor chip 700 may be (mounted) on the third redistribution substrate 600. The second semiconductor chip 700 may be coupled to the third pads 622 through first connection terminals 730. The second semiconductor chip 700 may be electrically connected through the first connection terminals 730 to the third redistribution substrate 600. The first connection terminals 730 may be provided between the third pads 622 and the third chip pads 724. As the second semiconductor chip 700 is mounted through the first connection terminals 730 on the third redistribution substrate 600, the lower surface of the second semiconductor chip 700 may be spaced apart from the third redistribution substrate 600 (by the first connection terminals 730). The first connection terminals 730 may include, for example, solder balls and/or solder bumps.

A first underfill layer 740 may be provided between the upper surface of the third redistribution substrate 600 and the lower surface of the second semiconductor chip 700. The first underfill layer 740 may at least partially fill a space between the third redistribution substrate 600 and the second semiconductor chip 700, and may extend around (e.g., surround) the third chip pads 724, the first connection terminals 730, and the third pads 622 that are connected (e.g., electrically connected) through the first connection terminals 730 to the third chip pads 724.

A second molding layer 750 may be provided on the third redistribution substrate 600. On the third redistribution substrate 600, the second molding layer 750 may cover or overlap the third pads 622 and may extend around (e.g., surround) the first underfill layer 740. In addition, the second molding layer 750 may be on (e.g., extend around or surround) the second semiconductor chip 700 and may expose the upper surface of the second semiconductor chip 700. An upper surface of the second molding layer 750 may be coplanar with that of the second semiconductor chip 700. The second molding layer 750 may include, for example, an epoxy molding compound (EMC).

In some embodiments, as illustrated in FIG. 4, the second molding layer 750 may be omitted. This configuration may expose the upper surface and outer side (outer lateral) surfaces of the second semiconductor chip 700 and a portion of the upper surface of the third redistribution substrate 600. The following description will be continuously disclosed with reference to FIG. 1.

The module structure MS may be (mounted) on the first redistribution substrate 100. The second redistribution substrate 300 of the module structure MS may be in contact with the first redistribution substrate 100, and the module structure MS may be connected (e.g., electrically connected) or coupled to the first redistribution substrate 100 through the first substrate wiring pattern 120 that extends in (e.g., penetrates) the uppermost first substrate dielectric pattern 110 to be connected (e.g., electrically connected) or coupled to the second pads 324. Therefore, the module structure MS may be electrically connected through the first substrate wiring pattern 120 to the first connection substrate 200 and the external terminals 130.

According to some embodiments, as the first lower pads 224 of the first connection substrate 200 and the second pads 324 provided on/at a lower surface of the module structure MS are in direct contact with the first substrate wiring pattern 120 of the first redistribution substrate 100, no solder ball or the likes may be provided between the first connection substrate 200 and the first redistribution substrate 100 and between the module structure MS and the first redistribution substrate 100. Accordingly, the semiconductor package 10 may become smaller in size and may improve (e.g., increase) in structural stability.

A third molding layer 760 may be provided on the first redistribution substrate 100. On the first redistribution substrate 100, the third molding layer 760 may be on (e.g., cover or overlap) the first connection substrate 200 and the module structure MS. In the first opening OP1 of the first connection substrate 200, the third molding layer 760 may at least partially fill a space between the first connection substrate 200 and the module structure MS. The third molding layer 760 may cover or overlap the upper surface of the first connection substrate 200 and the upper surface of the module structure MS. The third molding layer 760 may include, for example, a dielectric polymer material, such as an epoxy molding compound (EMC). In some embodiments, the third molding layer 760 may include, for example, an epoxy dielectric film, such as an Ajinomoto build-up film (ABF).

A fourth redistribution substrate 800 may be provided on the third molding layer 760. The fourth redistribution substrate 800 may be substantially similar to the third redistribution substrate 600 discussed above. The fourth redistribution substrate 800 may include a fourth substrate wiring layer or at least two stacked fourth substrate wiring layers. Each of the fourth substrate wiring layers may include a fourth substrate dielectric pattern 810 and a fourth substrate wiring pattern 820 in the fourth substrate dielectric pattern 810. The fourth substrate wiring pattern 820 provided in (or on an upper surface of) an uppermost fourth substrate wiring layer may be referred to as fourth pads 822 to which is connected (e.g., electrically connected) coupled an external apparatus mounted on the fourth redistribution substrate 800. As used hereinafter, the terms "external/outside configuration", "external/outside device", "external/outside apparatus", "external/outside power", "external/outside signal", or "outside" are intended to broadly refer to a device, apparatus, circuit, block, module, power, and/or signal that resides externally (e.g., outside of a functional or physical boundary) with respect to a given circuit, block, module, system, or device.

The fourth substrate wiring pattern 820 may have a damascene structure. For example, the fourth substrate wiring pattern 820 may have a via that protrudes from a lower surface thereof. The via may vertically connect (e.g., electrically connect) the fourth substrate wiring patterns 820 of (two) neighboring (e.g., adjacent) fourth substrate wiring layers. The via may connect (e.g., electrically connect) the fourth substrate wiring pattern 820 of the uppermost fourth substrate wiring layer and the first connection substrate 200. For example, the via may extend in (e.g., penetrate) a lowermost fourth substrate dielectric pattern 810 to be connected (e.g., electrically connected) or coupled to the first upper pads 222 of the first connection substrate 200. According to some embodiments, as illustrated in FIG. 3, the via may extend in (e.g., penetrate) the lowermost fourth substrate dielectric pattern 810 to be connected (e.g., electrically connected) or coupled to the first upper pads 222 and/or the fourth chip pads 722 of the second semiconductor chip 700. In this configuration, a lower portion of the fourth substrate wiring pattern 820 positioned on/at an upper surface of the fourth substrate dielectric pattern 810 may be referred to as a head part used as a horizontal line or pad, and the via of the fourth substrate wiring pattern 820 may be referred to as a tail part (used as a vertical connection). The fourth substrate wiring pattern 820 may have a T shape (referring to FIG. 3).

The semiconductor package 10 may be provided as discussed above. According to some embodiments of the present inventive concepts, the semiconductor package 10 may be configured such that the module structure MS may be provided between the first redistribution substrate 100 and the fourth redistribution substrate 800, and that the first connection substrate 200 may be provided to reside on (e.g., to be adjacent) a side (e.g., a side surface) of the module structure MS and to connect (e.g., electrically connect) the first redistribution substrate 100 and the fourth redistribution substrate 800. In this case, as the first base layer 210 of the first connection substrate 200 is divided into a plurality of dielectric layers, the first vias 226 may have their reduced ratio. Thus, even though the module structure MS having a large height is provided to increase a distance between the first redistribution substrate 100 and the fourth redistribution substrate 800, the first connection substrate 200 may be used to stably connect (e.g., electrically connect) the first redistribution substrate 100 and the fourth redistribution substrate 800. Accordingly, the semiconductor package 10 may improve (e.g., increase) in structural stability.

According to some embodiments of the present inventive concepts, the first semiconductor chip 500 may include the first through vias 512 that extend in (e.g., penetrate) the first semiconductor substrate 510 of the first semiconductor chip 500. The second redistribution substrate 300 may be connected (e.g., electrically connected) through the first through vias 512 to the third redistribution substrate 600. Therefore, a reduced electrical connection length may be provided between the second redistribution substrate 300 and the third redistribution substrate 600.

According to some embodiments of the present inventive concepts, the second semiconductor chip 700 may include the second through vias 712 that extend in (e.g., penetrate) the second semiconductor substrate 710 of the second semiconductor chip 700. In this case, the third redistribution substrate 600 may be connected (e.g., electrically connected) through the second through vias 712 to the fourth redistribution substrate 800. Therefore, a reduced electrical connection length may be provided between the third redistribution substrate 600 and the fourth redistribution substrate 800. Accordingly, the semiconductor package 10 may improve in electrical properties.

In the embodiments that follow, a detailed description of technical features repetitive to those discussed above with reference to FIGS. 1 to 4 may be omitted, and a difference thereof will be discussed in detail. The same reference numerals may be allocated to the same components of the semiconductor package 10 discussed above according to some embodiments of the present inventive concepts.

FIG. 5 illustrates a cross-sectional view showing a semiconductor package according to some embodiments of the present inventive concepts.

Referring to FIG. 5, a semiconductor package 12 may be provided. The semiconductor package 12 may be substantially similar to the semiconductor package 10 discussed above with reference to FIGS. 1 to 4.

A first redistribution substrate 100 may be provided in a lower portion of the semiconductor package 12. The first redistribution substrate 100 may include a first substrate wiring layer or at least two first substrate wiring layers. The first substrate wiring layers may include a first substrate dielectric pattern 110 and a first substrate wiring pattern 120 in the first substrate dielectric pattern 110. The first substrate wiring pattern 120 in one first substrate wiring layer may be electrically connected to the first substrate wiring pattern 120 in another (e.g., adjacent another) first substrate wiring layer.

The first substrate wiring pattern 120 may be provided on an upper surface of the first substrate dielectric pattern 110. The first substrate wiring pattern 120 may horizontally extend on the upper surface of the first substrate dielectric pattern 110. For example, the first substrate wiring pattern 120 may extend parallel with the upper surface of the first substrate dielectric pattern 110. The first substrate wiring pattern 120 may protrude from the upper surface of the first substrate dielectric pattern 110. The first substrate wiring pattern 120 may be covered or overlapped with another first substrate dielectric pattern 110 that overlies the first substrate dielectric pattern 110. The first substrate wiring pattern 120 (of the uppermost first substrate wiring layer) may be referred to as fifth pads 122 to which third connection terminals 140 are connected (e.g., electrically connected) or coupled which will be discussed below. As discussed above, the first substrate wiring pattern 120 may include a pad or line part of the first substrate wiring layer. For example, the first substrate wiring pattern 120 may include a component for horizontal redistribution in the first redistribution substrate 100.

The first substrate wiring pattern 120 may have a damascene structure. For example, the first substrate wiring pattern 120 may have a via that protrudes from a lower surface thereof. The via may extend in (e.g., penetrate) the first substrate dielectric pattern 110 to be connected (e.g., electrically connected) or coupled to sixth pads 126 disposed on/at a lower surface of the first redistribution substrate 100 (e.g., a lower surface of the lowermost first substrate dielectric pattern 110). In this configuration, an upper portion of the first substrate wiring pattern 120 positioned on/at the upper surface of the first substrate dielectric pattern 110 may be referred to as a head part used as a horizontal line or pad, and the via of the first substrate wiring pattern 120 may be referred to as a tail part (used as a vertical connection). The first substrate wiring pattern 120 may have a T shape (referring to FIG. 5).

A second substrate protection layer 150 may be provided on an upper surface of the first redistribution substrate 100. The second substrate protection layer 150 may cover or overlap an upper surface of an uppermost first substrate wiring layer and may expose upper surfaces of the fifth pads 122. In some embodiments, the second substrate protection layer 150 may be omitted. The second substrate protection layer 150 may include, for example, a dielectric polymer and/or a photo-imageable dielectric (PID).

A module structure MS and a first connection substrate 200 may be (mounted on) the first redistribution substrate 100. Third connection terminals 140 may be interposed between the fifth pads 122 and first lower pads 224 and between the fifth pads 122 and second pads 324. The first redistribution substrate 100 may be electrically connected through the third connection terminals 140 to the module structure MS and the first connection substrate 200. The third connection terminals 140 may include, for example, solder balls and/or solder bumps.

A fourth underfill layer 162 may be interposed between the upper surface of the first redistribution substrate 100 and a lower surface of the first connection substrate 200. The fourth underfill layer 162 may at least partially fill a space between the first redistribution substrate 100 and the first connection substrate 200. The fourth underfill layer 162 may be on (e.g., cover or overlap) the third connection terminals 140 connected (e.g., electrically connected) to the first lower pads 224, and may also be on (e.g., cover or overlap) the fifth pads 122 connected (e.g., electrically connected) to the first lower pads 224 through the third connection terminals 140. The fourth underfill layer 162 may extend around (e.g., surround) the third connection terminals 140.

A fifth underfill layer 164 may be provided between the upper surface of the first redistribution substrate 100 and a lower surface of the module structure MS. The fifth underfill layer 164 may at least partially fill a space between the first redistribution substrate 100 and the module structure MS. The fifth underfill layer 164 may be on (e.g., cover or overlap) the third connection terminals 140 connected (e.g., electrically connected) to the second pads 324, and may also be on (e.g., cover or overlap) the fifth pads 122 connected (e.g., electrically connected) to the second pads 324 through the third connection terminals 140. The fifth underfill layer 164 may extend around (e.g., surround) the third connection terminals 140.

According to some embodiments of the present inventive concepts, in the module structure MS, as the second chip pads 524 provided on a lower surface of the first semiconductor chip 500 are in direct contact with the second substrate wiring pattern 320 of the second redistribution substrate 300 provided under the first semiconductor chip 500, no solder ball or the likes may be provided between the first semiconductor chip 500 and the second redistribution substrate 300. Therefore, the module structure MS and the semiconductor package 12 may become smaller in size. Accordingly, the semiconductor package 12 may improve (e.g., increase) in structural stability.

Figure 6:
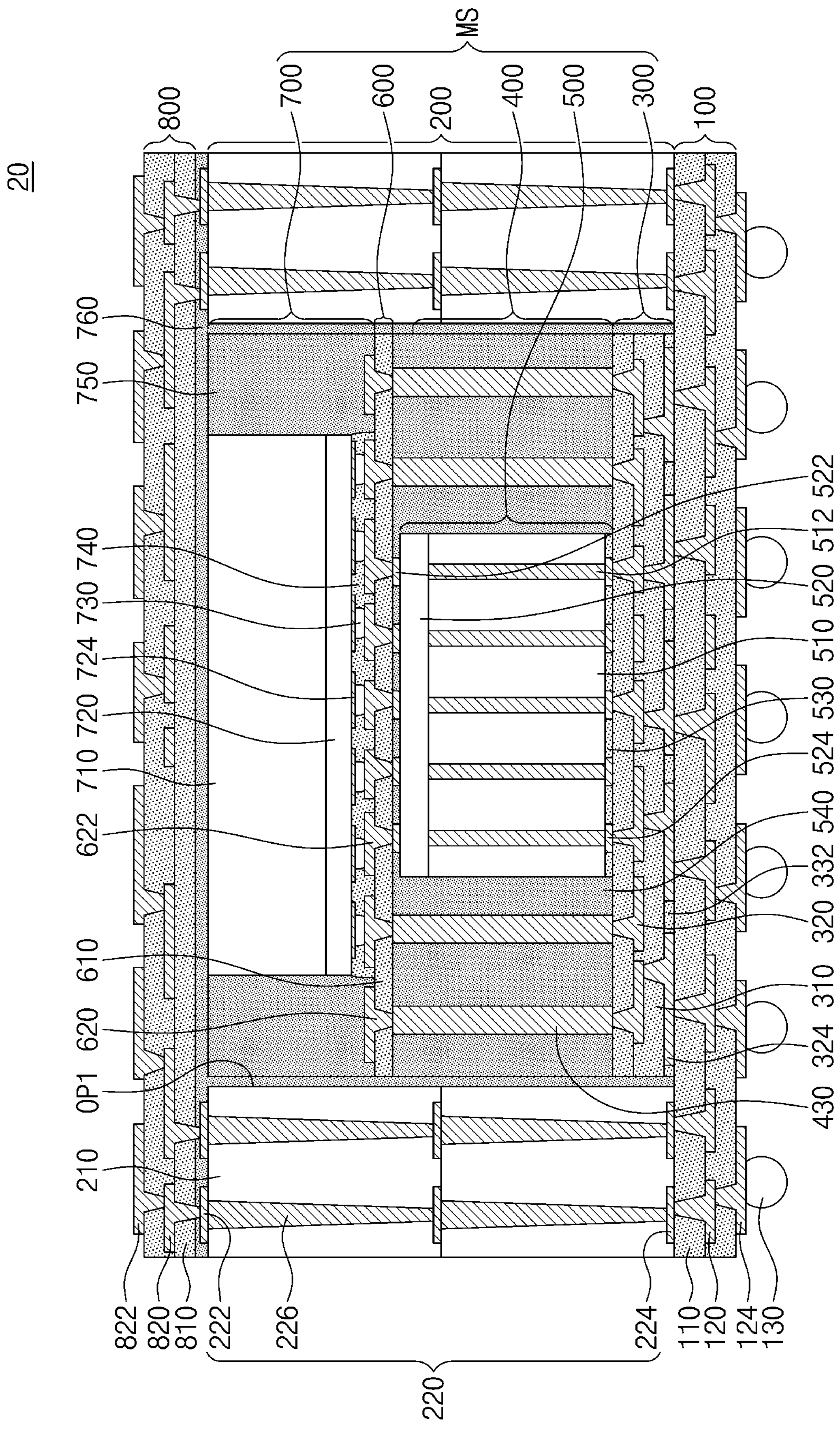

FIG. 6 illustrates a cross-sectional view showing a semiconductor package according to some embodiments of the present inventive concepts.

Referring to FIG. 6, a semiconductor package 20 may be provided. The semiconductor package 20 may be substantially similar to the semiconductor package 10 discussed above with reference to FIGS. 1 to 4.

A second redistribution substrate 300 may be provided thereon with a first semiconductor chip 500, conductive posts 430, and a first molding layer 540. The first semiconductor chip 500 may be substantially the same as or similar to the first semiconductor chip 500 discussed above with reference to FIGS. 1 to 4. The first semiconductor chip 500 may be disposed on a central region of the second redistribution substrate 300 in a plan view. On the second redistribution substrate 300, the first semiconductor chip 500 may be spaced apart from the conductive posts 430 in a direction parallel to an upper surface of the second redistribution substrate 300. The first molding layer 540 may be on (e.g., cover or overlap) the first semiconductor chip 500, and may also be on (e.g., cover or overlap) the conductive posts 430. The first molding layer 540 may extend around (e.g., surround) the conductive posts 430. The conductive posts 430 may be disposed on a side (e.g., a side surface) of the first semiconductor chip 500. For example, the conductive posts 430 may be adjacent the first semiconductor chip 500. The conductive posts 430 may be disposed between an outer side (outer lateral) surface of the first semiconductor chip 500 and an outer side (outer lateral) surface of the first molding layer 540. The conductive posts 430 may vertically extend in (e.g., penetrate) the first molding layer 540. The conductive posts 430 may have their ends that extend toward a lower (or upper) surface of the second redistribution substrate 300. The conductive posts 430 may have their lower surfaces that are exposed from a lower surface of the first molding layer 540. For example, the lower surfaces of the conductive posts 430 may be coplanar with the lower surface of the first molding layer 540. The conductive posts 430 may extend in (e.g., penetrate) the first molding layer 540 to be connected (e.g., electrically connected) or coupled to a second substrate wiring pattern 320 of the second redistribution substrate 300. The conductive posts 430 may have other ends that extend toward a lower surface of a third redistribution substrate 600. The conductive posts 430 may have their upper surfaces that are exposed from an upper surface of the first molding layer 540. For example, the upper surfaces of the conductive posts 430 may be coplanar with that of the first molding layer 540. The conductive posts 430 may extend in (e.g., penetrate) the first molding layer 540 to be connected (e.g., electrically connected) or coupled to a third substrate wiring pattern 620 of the third redistribution substrate 600. For example, the second redistribution substrate 300 may be connected (e.g., electrically connected) through the conductive posts 430 to the third redistribution substrate 600. The conductive posts 430 may include, for example, a conductive material, such as copper (Cu).

Figure 7:
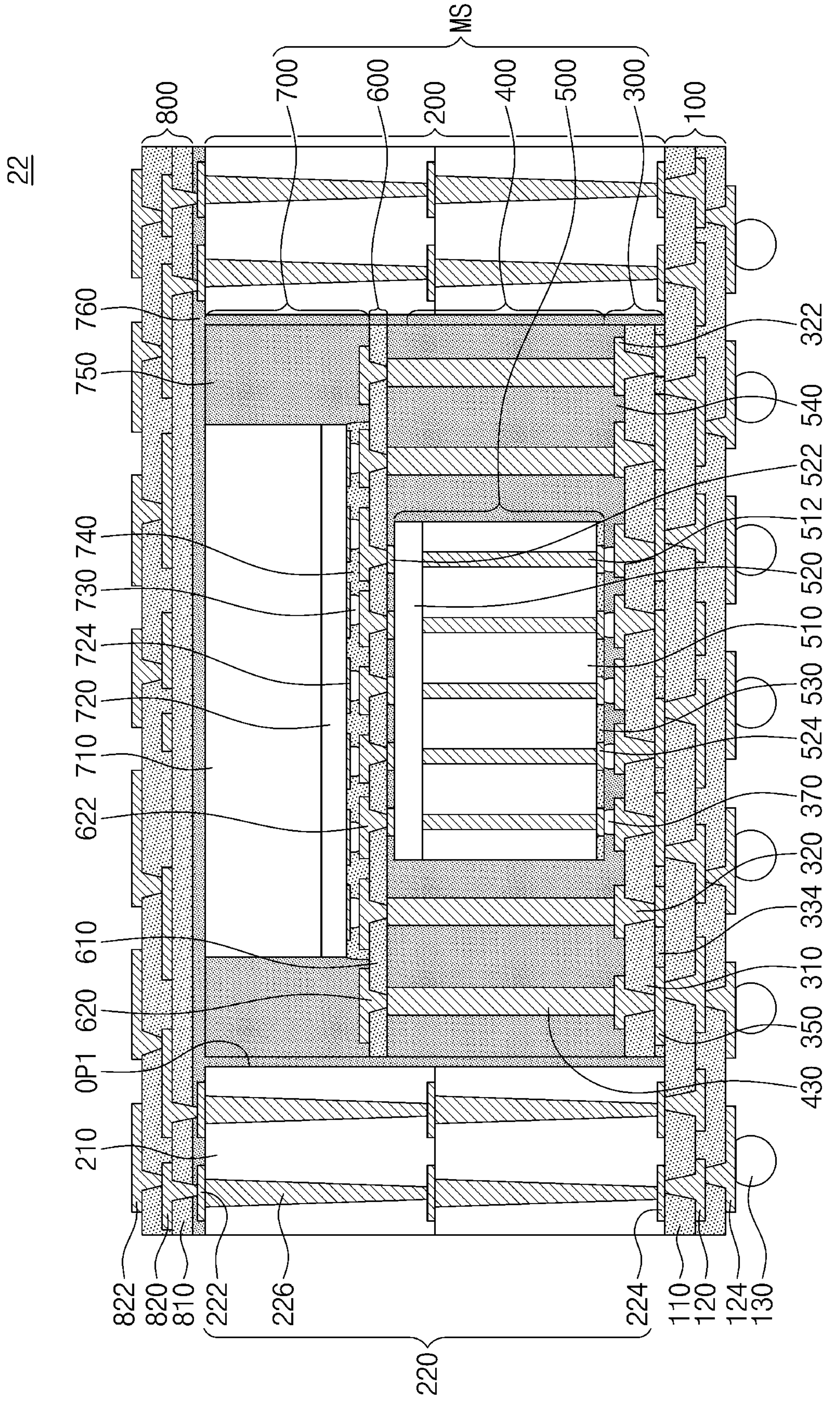

FIG. 7 illustrates a cross-sectional view showing a semiconductor package according to some embodiments of the present inventive concepts.

Referring to FIG. 7, a semiconductor package 22 may be provided. The semiconductor package 22 may be substantially similar to the semiconductor package 20 discussed above with reference to FIG. 6.

A second redistribution substrate 300 may be provided below a module structure MS. The second redistribution substrate 300 may include a second substrate wiring layer. The second substrate wiring layer may include a second substrate dielectric pattern 310 and a second substrate wiring pattern 320 in the second substrate dielectric pattern 310.

The second substrate wiring pattern 320 may be provided on/at an upper surface of the second substrate dielectric pattern 310. The second substrate wiring pattern 320 may horizontally extend on the upper surface of the second substrate dielectric pattern 310. The second substrate wiring pattern 320 may protrude from the upper surface of the second substrate dielectric pattern 310. The second substrate wiring pattern 320 may be referred to as seventh pads 322 to which fourth connection terminals 370 are connected (e.g., electrically connected) coupled which will be discussed below. The second substrate wiring pattern 320 may be a pad or line part of the second substrate wiring layer. For example, the second substrate wiring pattern 320 may include a component for horizontal redistribution in the second redistribution substrate 300.

The second substrate wiring pattern 320 may have a damascene structure. For example, the second substrate wiring pattern 320 may have a via that protrudes from a lower surface thereof. The via may extend in (e.g., penetrate) the second substrate dielectric pattern 310 to be connected (e.g., electrically connected) or coupled to redistribution pads 350 disposed on/at a lower surface of the second redistribution substrate 300. In this configuration, an upper portion of the second substrate wiring pattern 320 positioned on/at the upper surface of the second substrate dielectric pattern 310 may be referred to as a head part used as a horizontal line or pad, and the via of the second substrate wiring pattern 320 may be referred to as a tail part (used as a vertical connection). The second substrate wiring pattern 320 may have a T shape (referring to FIG. 7).

FIG. 7 depicts that the second redistribution substrate 300 includes one second substrate wiring layer, but the present inventive concepts are not limited thereto. The second redistribution substrate 300 may include at least two second substrate wiring layers. The seventh pads 322 may be the second substrate wiring pattern 320 provided in an uppermost second substrate wiring layer (e.g., on an upper surface of the uppermost second substate dielectric pattern 310). In addition, the via connected (e.g., electrically connected) to the redistribution pads 350 may be the second substrate wiring pattern 320 provided in a lowermost second substrate wiring layer (e.g., on a lower surface of the lowermost second substrate dielectric pattern 310).

A third substrate protection layer 334 may be provided on a lower surface of the second redistribution substrate 300 (e.g., on a lower surface of the lowermost second substrate dielectric pattern 310). The third substrate protection layer 334 may cover or overlap a lower surface of the lowermost second substrate wiring layer (e.g., on a lower surface of the lowermost second substrate dielectric pattern 310) and may expose lower surfaces of the redistribution pads 350. In some embodiments, differently from that shown, the third substrate protection layer 334 may be omitted. The third substrate protection layer 334 may include, for example, a dielectric polymer and/or a photo-imageable dielectric (PID).

A first semiconductor chip 500 may be (mounted) on the second redistribution substrate 300. Fourth connection terminals 370 may be interposed between the seventh pads 322 and second chip pads 524 of the first semiconductor chip 500. The second redistribution substrate 300 may be electrically connected through the fourth connection terminals 370 to the first semiconductor chip 500. No underfill layer may be separately provided below the first semiconductor chip 500. In some embodiments, differently from that shown, an underfill layer may be separately provided between the first semiconductor chip 500 and the second redistribution substrate 300, and may be on (e.g., cover or overlap) the fourth connection terminals 370 connected (e.g., electrically connected) to the second chip pads 524 and the seventh pads 322 connected (e.g., electrically connected) through the fourth connection terminals 370 to the second chip pads 524. For example, the underfill layer may extend around (e.g., surround) the fourth connection terminals 370 and the seventh pads 322. The fourth connection terminals 370 may include, for example, solder balls and/or solder bumps.

The fourth connection terminals 370 may not be provided below conductive posts 430. The conductive posts 430 may be in direct contact with the second substrate wiring pattern 320 and a third substrate wiring pattern 620 to come into electrical connection with the second redistribution substrate 300 and the third redistribution substrate 600.

The module structure MS may be (mounted) on a first redistribution substrate 100. The second redistribution substrate 300 may be electrically connected to a first redistribution substrate 100. The lower surface of the second redistribution substrate 300 may be in contact with an upper surface of the first redistribution substrate 100. The first redistribution substrate 100 may be connected (e.g., electrically connected) or coupled through the first substrate wiring pattern 120 to the second redistribution substrate 300.

According to some embodiments of the present inventive concepts, as the redistribution pads 350 provided on a lower surface of the module structure MS are in direct contact with first substrate wiring pattern 120 of the first redistribution substrate 100, no solder ball or the likes may be provided between the module structure MS and the first redistribution substrate 100. Accordingly, the semiconductor package 22 may become smaller in size and may improve (e.g., increase) in structural stability.

Figure 8:
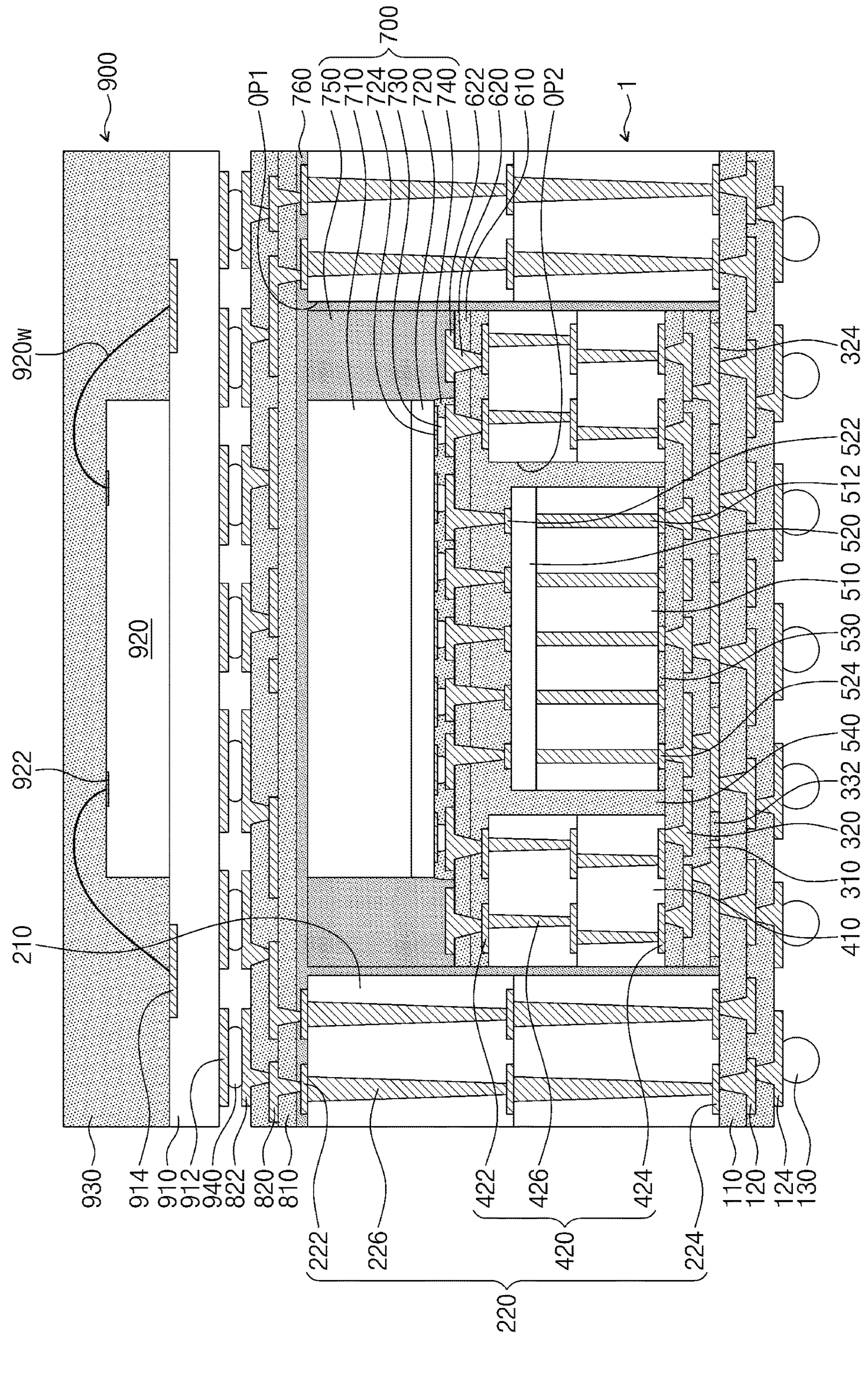

FIG. 8 illustrates a cross-sectional view showing a semiconductor package according to some embodiments of the present inventive concepts.

Referring to FIG. 8, a semiconductor package 30 may include a lower package 1 and an upper package 900. The semiconductor package 30 may be a package-on-package (PoP) in which the upper package 900 is (mounted) on the lower package 1.

The lower package 1 may be substantially the same as or similar to one of the semiconductor packages 10, 12, 20, and 22 discussed with reference to FIGS. 1 to 7. For example, the lower package 1 may include a first redistribution substrate

100, a first connection substrate 200, a module structure MS, a third molding layer 760, and a fourth redistribution substrate 800.

The module structure MS may include a second redistribution substrate 300, a second connection substrate 400, a first semiconductor chip 500, a first molding layer 540, a third redistribution substrate 600, a second semiconductor chip 700, and a second molding layer 750. In some embodiments, differently from that shown, the module structure MS may include conductive posts 430 instead of the second connection substrate 400.

The upper package 900 may be (mounted) on (an upper surface of) the lower package 1. The upper package 900 may include an upper package substrate 910, an upper package chip 920, and an upper molding layer 930.

The upper package substrate 910 may be a printed circuit board (PCB). In some embodiments, the upper package substrate 910 may be a redistribution substrate.

The upper package chip 920 may be disposed on (upper surface of) the upper package substrate 910. The upper package chip 920 may include integrated circuits, and the integrated circuits may include, for example, a memory circuit, a logic circuit, and/or a combination thereof. The upper package chip 920 may be a semiconductor chip whose type is different from that of the first and second semiconductor chips 500 and 700. For example, the upper package chip 920 may be a memory chip. The upper package chip 920 may include upper chip pads 922 electrically connected through bonding wires 920*w* to eighth pads 914 provided on/at an upper surface of the upper package substrate 910. FIG. 8 depicts that the upper package chip 920 is mounted in a wire bonding method, but the upper package chip 920 may be mounted in various ways. In addition, FIG. 8 depicts that one upper package chip 920 is mounted, but the present inventive concepts are not limited thereto. At least two package chips may be mounted (e.g., stacked) on the upper package substrate 910.

The upper package substrate 910 may be provided thereon with the upper molding layer 930 that is on (e.g., covers or overlap) the upper package chip 920. The upper molding layer 930 may include, for example, a dielectric polymer, such as an epoxy-based polymer.

Fifth connection terminals 940 may be disposed between the lower package 1 and the upper package 900. The fifth connection terminals 940 may be interposed between a fourth substrate wiring pattern 820 disposed an upper surface of the fourth redistribution substrate 800 (e.g., an upper surface of the uppermost fourth substrate dielectric pattern 810) and ninth pads 912 provided on a lower surface of the upper package substrate 910, and thus the fourth substrate wiring pattern 820 and the ninth pads 912 may be electrically connected to each other. Therefore, the upper package 900 may be electrically connected through the fifth connection terminals 940, the fourth redistribution substrate 800, the first connection substrate 200, and the first redistribution substrate 100 to external terminals 130 and the first and second semiconductor chips 500 and 700 of the module structure MS.

FIGS. 9 to 19 illustrate cross-sectional views showing a method of fabricating a semiconductor package according to some embodiments of the present inventive concepts. FIGS. 9 to 15 depict a method of forming a module structure. FIGS. 16 to 19 depict a method of fabricating a semiconductor package by using a module structure and a connection substrate.

Figure 9:
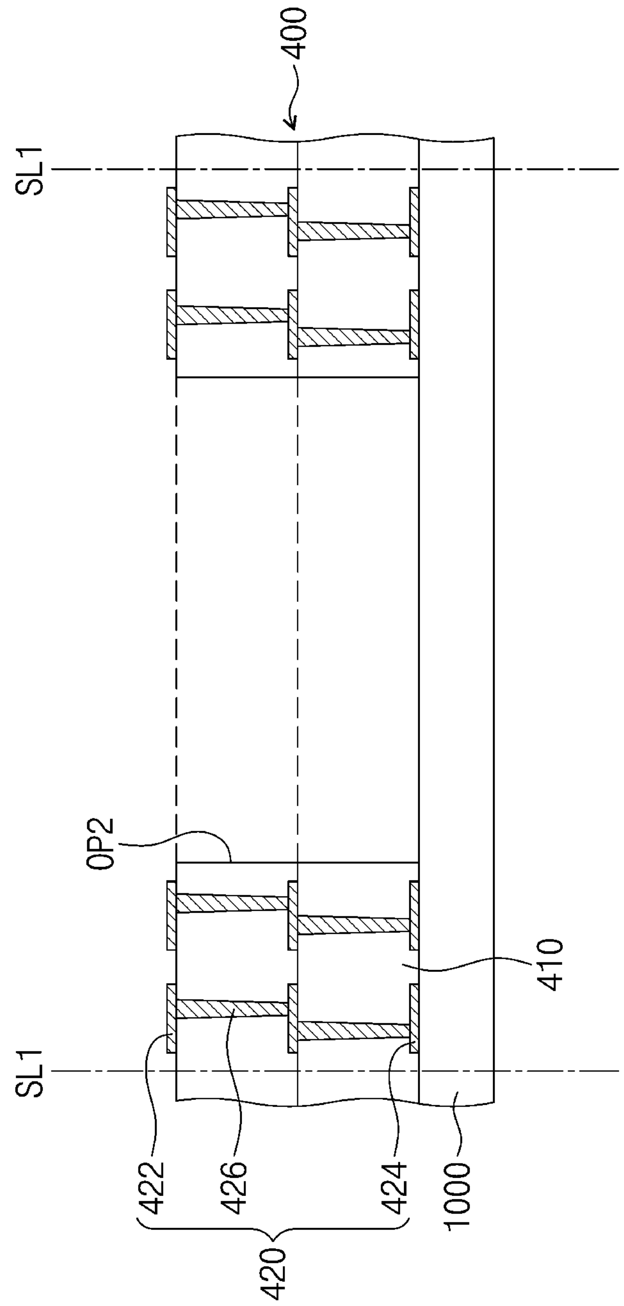
FIGS. 9 to 19 illustrate cross-sectional views showing a method of fabricating a semiconductor package according to some embodiments of the present inventive concepts.

Referring to FIG. 9, a second connection substrate 400 may be provided. The second connection substrate 400 may be substantially the same as or similar to the second connection substrate 400 discussed with reference to FIG. 1. For example, the second connection substrate 400 may include a second base layer 410 and a second conductive member 420. The second conductive member 420 may include second upper pads 422, second lower pads 424, and second vias 426.

A first carrier substrate 1000 may be attached to a lower surface of the second connection substrate 400. For example, the first carrier substrate 1000 may be a dielectric substrate including glass or polymer or may be a conductive substrate including metal. Although not shown, the first carrier substrate 1000 may be attached through a first adhesive member provided on an upper surface thereof to (a lower surface of) a lowermost second base layer 410 and (a lower surface of) the second lower pads 424.

A second opening OP2 may be formed in the second connection substrate 400. The second opening OP2 may be formed by removing a portion of the second connection substrate 400 to allow the second opening OP2 to extend in (e.g., penetrate) the second connection substrate 400. For example, the formation of the second opening OP2 may be performed by an etching process, such as drilling, laser ablation, and/or laser cutting. The removed portion of the second connection substrate 400 may be a space (the second opening OP2) in which a first semiconductor chip 500 is provided in a subsequent process.

Figure 10:
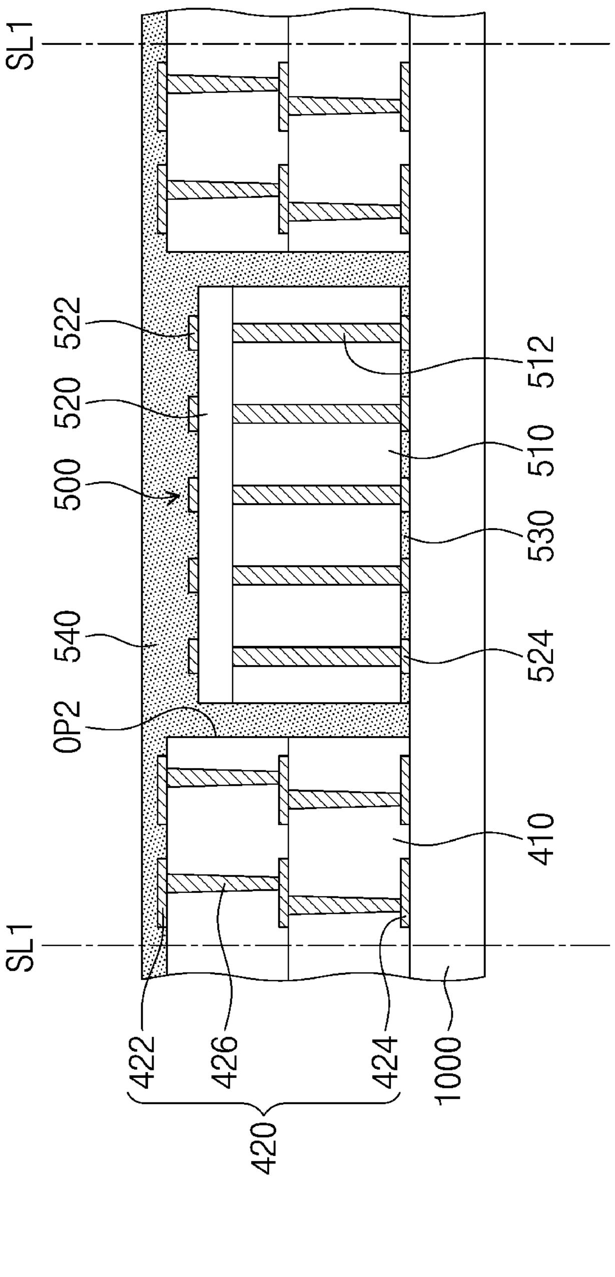

Referring to FIG. 10, a first semiconductor chip 500 may be provided on the first carrier substrate 1000. The first semiconductor chip 500 may be substantially the same as or similar to the first semiconductor chip 500 discussed above with reference to FIG. 1. The first semiconductor chip 500 may be disposed in the second opening OP2 in the second connection substrate 400. The first semiconductor chip 500 may be attached to the first carrier substrate 1000. In this case, a rear surface (e.g., a lower surface) of the first semiconductor chip 500 may be attached to the first carrier substrate 1000.

A first molding layer 540 may be formed on the first carrier substrate 1000. The first molding layer 540 may at least partially fill a space between the second connection substrate 400 and the first semiconductor chip 500. For example, a dielectric member may be injected between the second connection substrate 400 and the first semiconductor chip 500, and then the dielectric member may be cured to form the first molding layer 540. The first molding layer 540 may be on (e.g., provided to cover or overlap) the second connection substrate 400 and the first semiconductor chip 500. Therefore, the second upper pads 422 of the second connection substrate 400 may not be exposed, and first chip pads 522 of the first semiconductor chip 500 may not be exposed.

Figure 11:
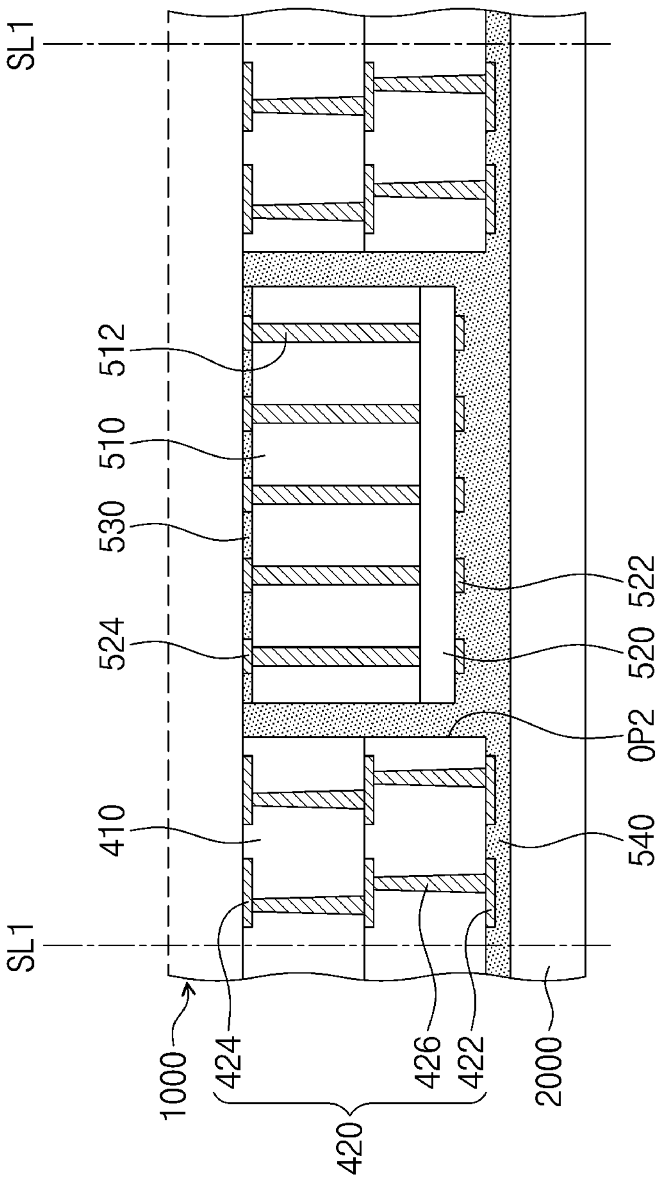

Referring to FIG. 11, a resultant structure of FIG. 10 may be overturned. Thus, the rear surface of the first semiconductor chip 500 may be positioned upwardly.

The first carrier substrate 1000 may be removed. Therefore, the lower surface of the second connection substrate 400 (referring to FIG. 10) may be exposed, and a lower surface of the first semiconductor chip 500 (referring to FIG. 10) may be exposed. For example, the second lower pads 424 of the second connection substrate 400 may be exposed, and second chip pads 524 of the first semiconductor chip 500 may be exposed.

A second carrier substrate 2000 may be attached to a lower surface of the first molding layer 540 (referring to FIG. 11). The second carrier substrate 2000 may be substantially the same as or similar to the first carrier substrate 1000 discussed above with reference to FIG. 10. Although not shown, the second carrier substrate 2000 may be attached through a second adhesive member to the first molding layer 540.

Figure 12:
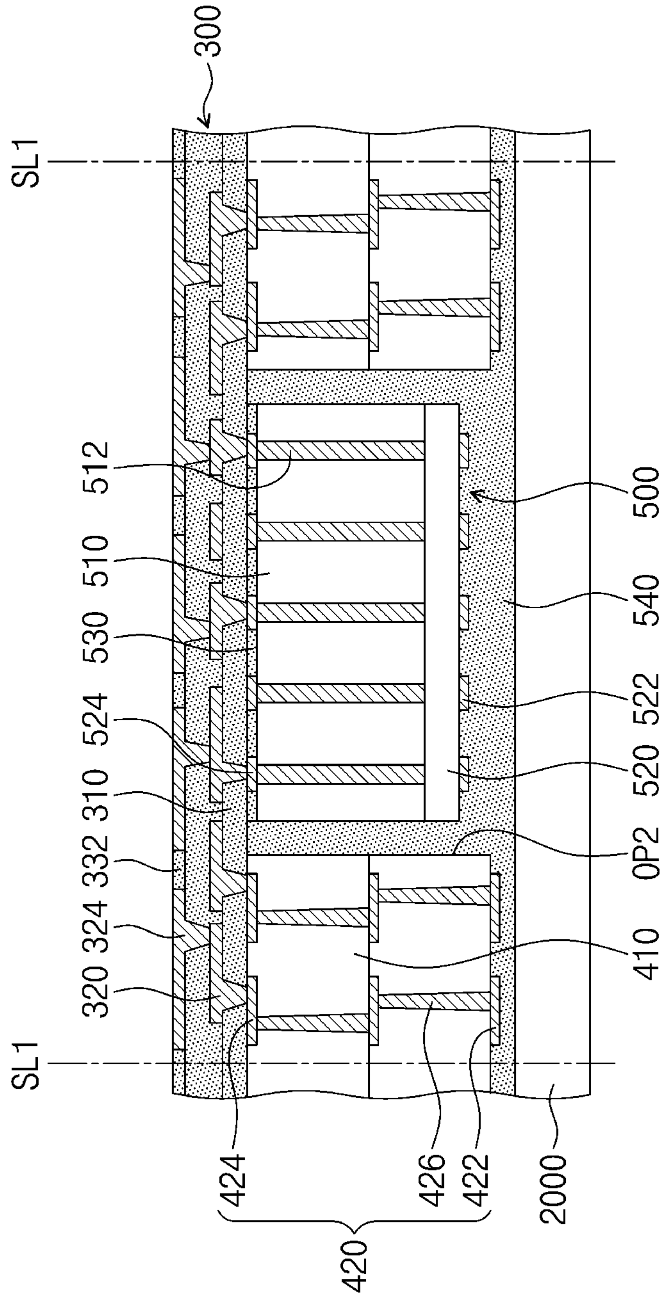

Referring to FIG. 12, a second redistribution substrate 300 may be formed on the second connection substrate 400, the first semiconductor chip 500, and the first molding layer 540. For example, a dielectric layer may be formed on the upper surface of the second connection substrate 400 (referring to FIG. 12) and an upper surface of the first semiconductor chip 500 (referring to FIG. 12), and then the dielectric layer may be patterned to form a second substrate dielectric pattern 310. A conductive layer may be formed on the second substrate dielectric pattern 310, and then the conductive layer may be patterned to form a second substrate wiring pattern 320, with the result that a second substrate wiring layer may be formed. The formation of the second substrate wiring layer may be repeatedly performed to form the second redistribution substrate 300 having a plurality of second substrate wiring layers. Second pads 324 may be defined to refer to the second substrate wiring pattern 320 provided in an uppermost second substrate wiring layer. For example, the second pads may be on/at an upper surface of the uppermost second substrate dielectric pattern 310. Afterwards, a first substrate protection layer 332 may be formed on (e.g., to cover or overlap) the second pads 324 of the second substrate wiring layers. For example, the first substrate protection layer 332 may extend around (e.g., surround) the second pads 324.

Figure 13:
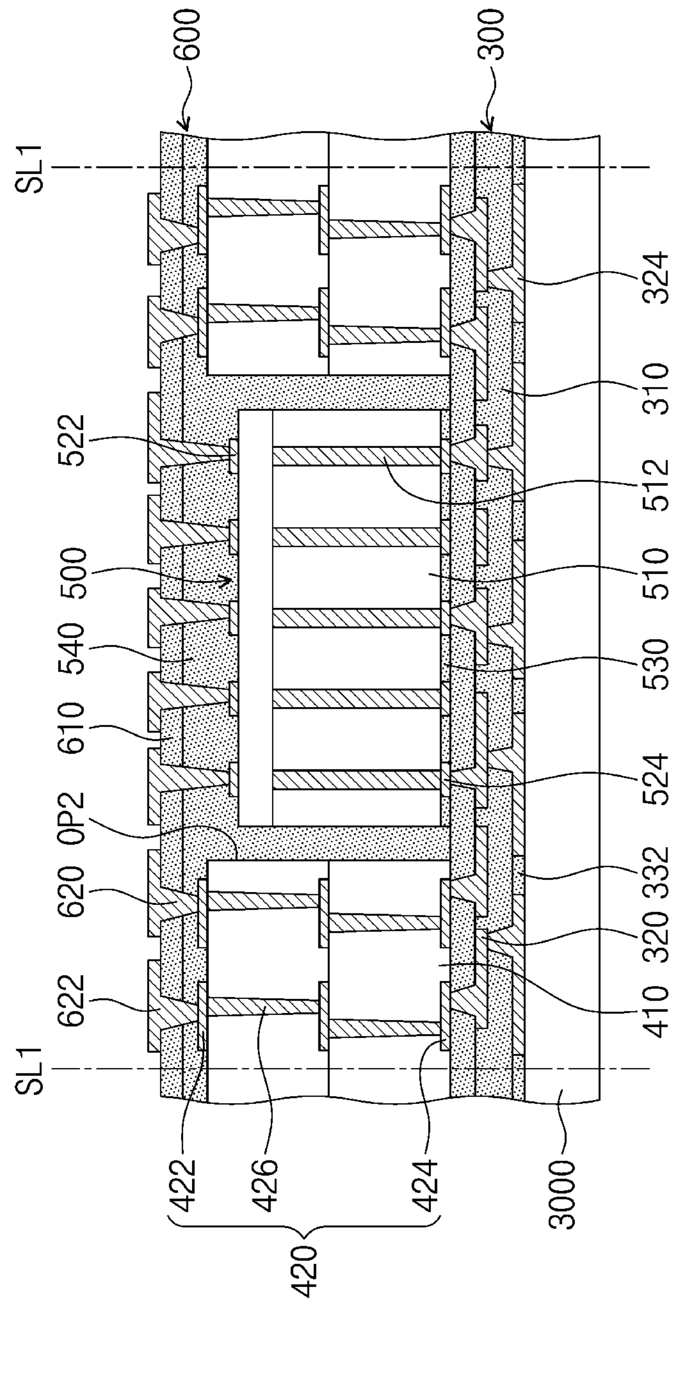

Referring to FIG. 13, a resultant structure of FIG. 12 may be overturned. Therefore, the second redistribution substrate 300 may be positioned below the first semiconductor chip 500.

The second carrier substrate 2000 may be removed. Therefore, an upper surface of the first molding layer 540 (referring to FIG. 13) may be exposed.

A third carrier substrate 3000 may be attached to a lower surface of the second redistribution substrate 300 (referring to FIG. 13). The third carrier substrate 3000 may be substantially the same as or similar to the first carrier substrate 1000 discussed above with reference to FIG. 9. Although not shown, the third carrier substrate 3000 may be attached through a third adhesive member provided on an upper surface thereof (referring to FIG. 13) to the first substrate protection layer 332 and the second pads 324.

A third redistribution substrate 600 may be formed on the first molding layer 540. For example, a dielectric layer may be formed on (e.g., an upper surface of) the first molding layer 540, and the dielectric layer may be patterned to form a third substrate dielectric pattern 610. For example, the dielectric layer may undergo an etching process that uses a laser such that a portion of the dielectric layer and a portion of the first molding layer 540 may be removed to form through holes that partially expose upper surfaces of the second upper pads 422 and upper surfaces of the first chip pads 522. The through holes may be at least partially filled with a conductive material to form a conductive layer on the third substrate dielectric pattern 610, and the conductive layer may be patterned to form a third substrate wiring pattern 620. It may thus be possible to form the third redistribution substrate 600 having one third substrate wiring layer. FIG. 13 depicts one third substrate wiring layer, but the present inventive concepts are not limited thereto. The formation of the third substrate dielectric pattern 610 and the third substrate wiring pattern 620 may be repeatedly performed to form the third redistribution substrate 600 having a plurality of third substrate wiring layers. Third pads 622 may be defined to refer to the third substrate wiring pattern 620 provided in an uppermost third substrate wiring layer. For example, the third pads 622 may be on/at an upper surface of the uppermost third substrate dielectric pattern 610.

Figure 14:
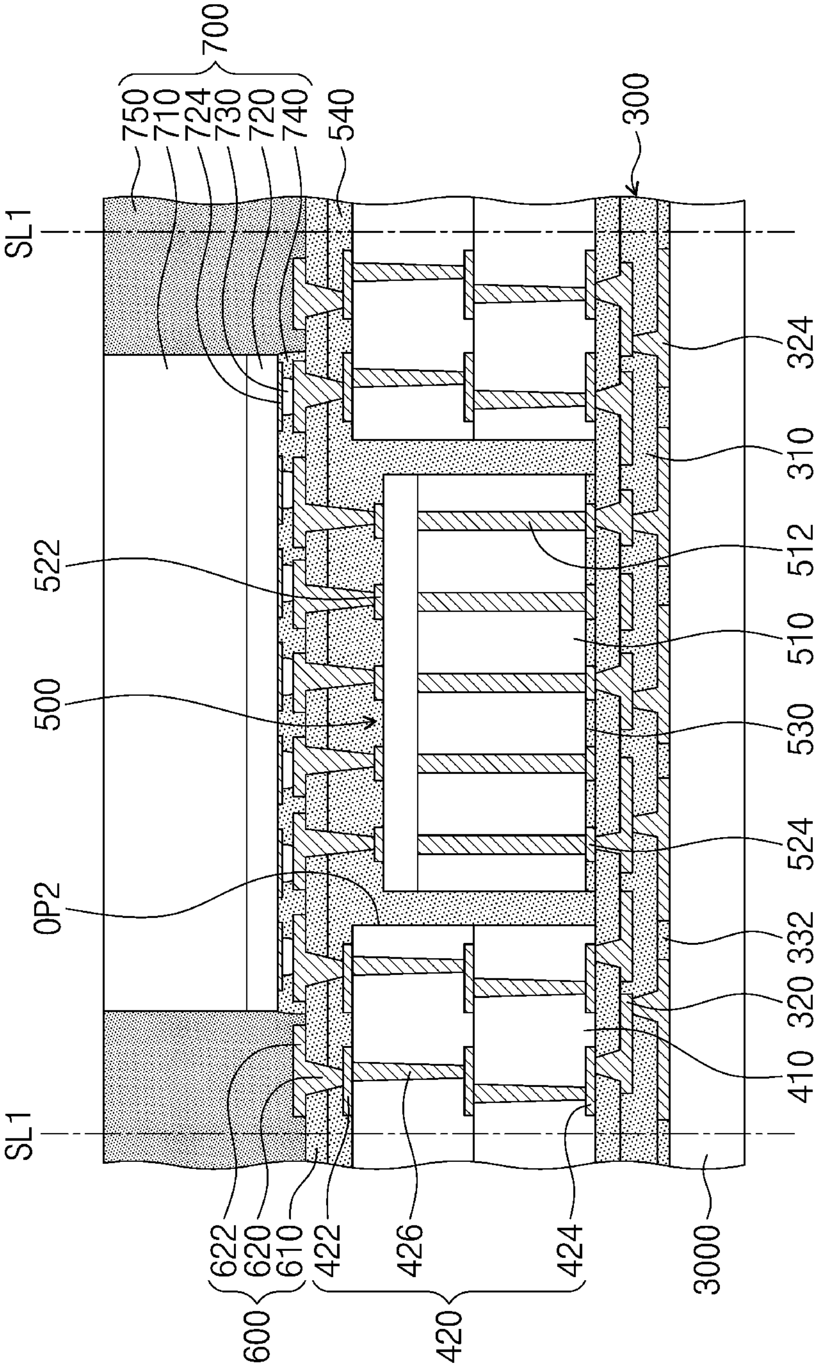

Referring to FIG. 14, a second semiconductor chip 700 may be provided on a resultant structure of FIG. 13. The second semiconductor chip 700 may be substantially the same as or similar to the second semiconductor chip 700 discussed above with reference to FIG. 1.

A second semiconductor chip 700 may be (mounted) on (an upper surface of) the third redistribution substrate 600. For example, solder balls may be provided on third chip pads 724 of the second semiconductor chip 700. The third chip pads 724 may be aligned with a portion (a subset) of the third substrate wiring patterns 620. After that, the second semiconductor chips 700 may descend to allow the solder balls to contact (the subset of) the third substrate wiring patterns 620, and then the solder balls may undergo a reflow process to form first connection terminals 730 that connect (e.g., electrically connected) the second semiconductor chip 700 to the third redistribution substrate 600. Thereafter, between the second semiconductor chip 700 and the third redistribution substrate 600, a first underfill layer 740 may be formed to on (e.g., extend around or surround) the third chip pads 724, the first connection terminals 730 attached to the third chip pads 724, and the third pads 622 attached to the first connection terminals 730.

A second molding layer 750 may be formed on the third redistribution substrate 600. For example, on the upper surface of the third redistribution substrate 600, a dielectric material may be coated to extend around (e.g., surround) the second semiconductor chip 700, the first underfill layer 740, and the third pads 622 not covered with the first underfill layer 740, and then the dielectric material may be cured to form the second molding layer 750. The second molding layer 750 may undergo a grinding process to expose an upper surface of the second semiconductor chip 700.

Figure 15:
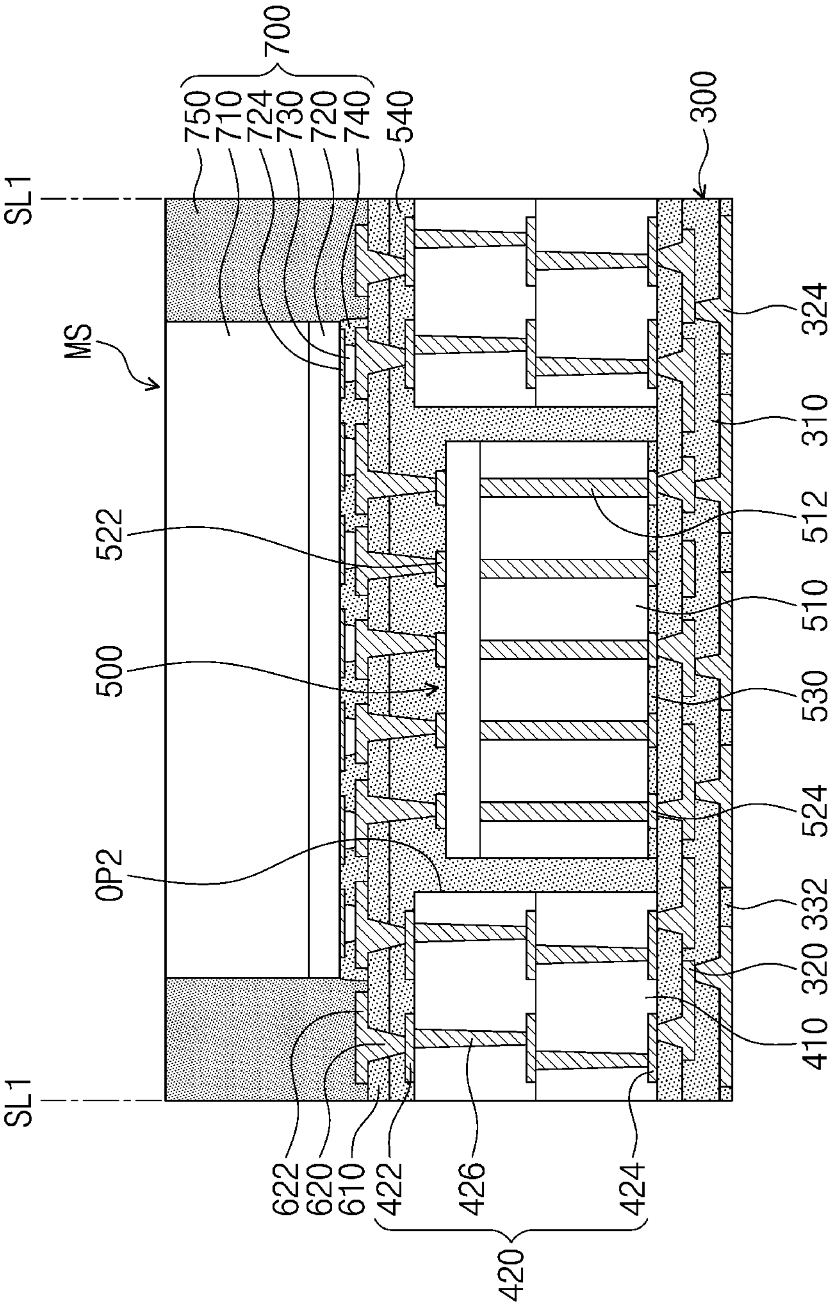

Referring to FIG. 15, a singulation process, such as sawing, may be performed to form module structures MS. For example, the sawing process may be executed along a first sawing line SL1. The sawing process may thus cut the first and second molding layers 540 and 750, the second and third redistribution substrates 300 and 600, and the second connection substrate 400, and may separate from each other the module structures MS in each of which the first semiconductor chip 500 is mounted on the second redistribution substrate 300 and the second semiconductor chip 700 is mounted on the third redistribution substrate 600.

According to some embodiments of the present inventive concepts, the process for forming the module structure MS may be performed separately from a subsequent process for forming a first connection substrate 200 and a subsequent process for embedding the module structure MS into the first connection substrate 200, and the process for forming the module structure MS may be variously changed if necessary (without modifying the subsequent processes for forming the first connection substrate 200 and embedding the module structure MS into the first connection substrate 200). Thus, the module structure MS may become modularized, and there may be provided a method of fabricating a semiconductor package whose fabrication process is simplified and whose manufacturing cost is reduced.

Figure 16:
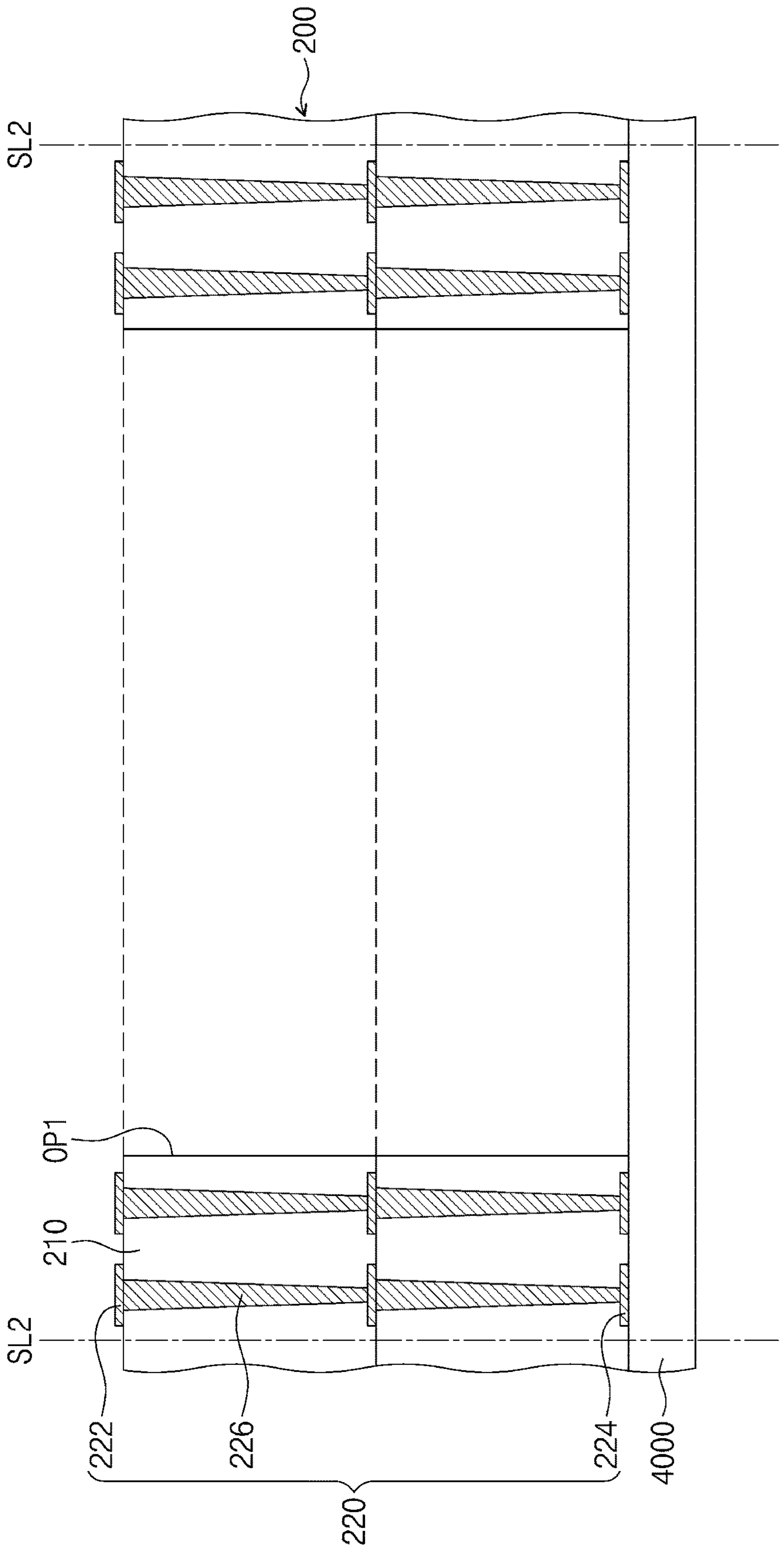

Referring to FIG. 16, a first connection substrate 200 may be provided. The first connection substrate 200 may be substantially the same as or similar to the first connection substrate 200 discussed with reference to FIG. 1. For example, the first connection substrate 200 may include a first base layer 210 and a first conductive member 220. The first conductive member 220 may include first upper pads 222, first lower pads 224, and first vias 226.

A fourth carrier substrate 4000 may be attached to a lower surface of the first connection substrate 200. The fourth carrier substrate 4000 may be substantially the same as or similar to the first carrier substrate 1000 discussed above with reference to FIG. 9. Although not shown, the fourth carrier substrate 4000 may be attached through a fourth adhesive member to a lowermost first base layer 210 and the first lower pads 224.

A first opening OP1 may be formed in the first connection substrate 200. A portion of the first connection substrate 200 may be removed to form the first opening OP1 that extends in (e.g., penetrates) the first connection substrate 200. For example, the formation of the first opening OP1 may be performed by an etching process, such as drilling, laser ablation, and/or laser cutting. The removed portion of the first connection substrate 200 (the first opening OP1) may be a space in which the module structure MS is provided in a subsequent process.

Figure 17:
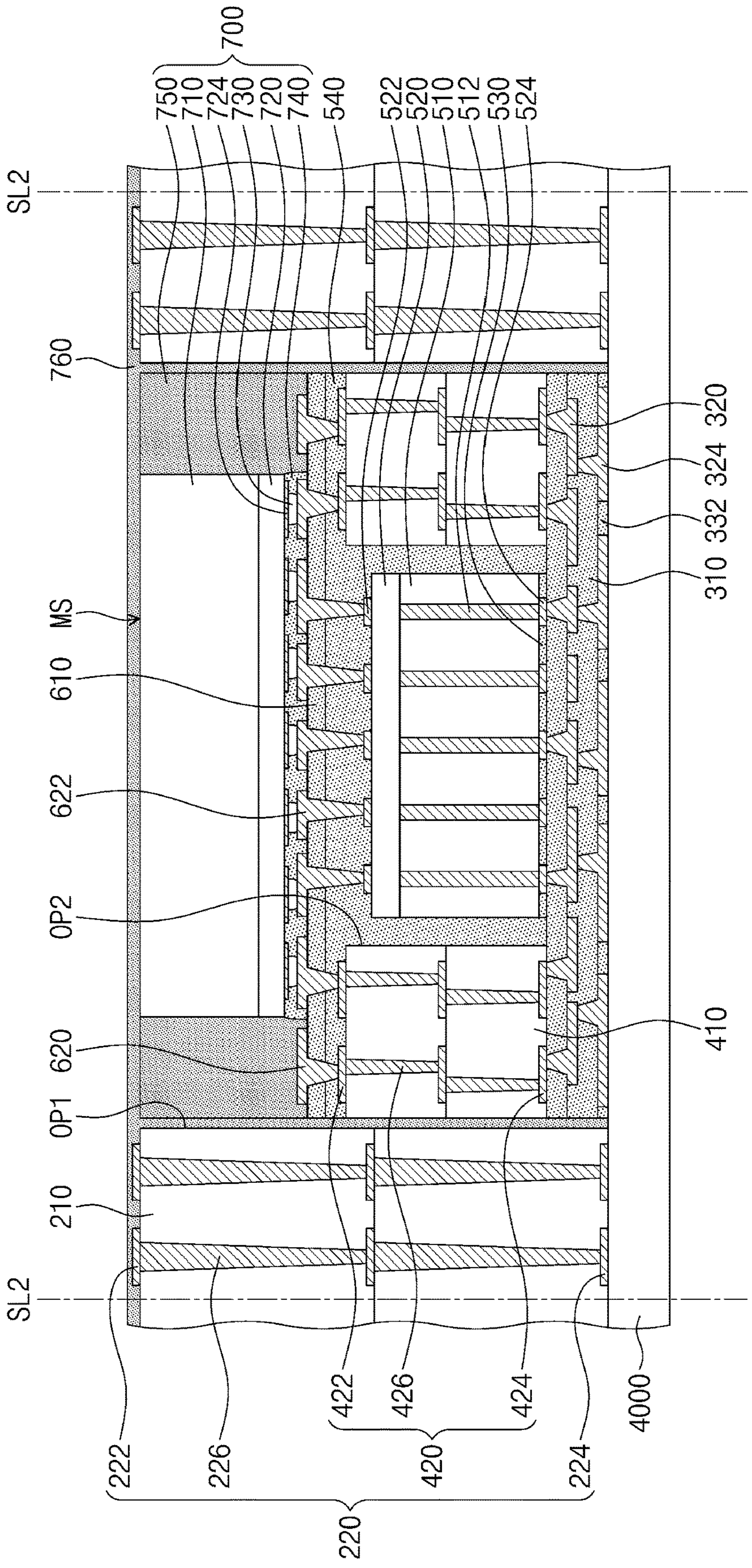

Referring to FIG. 17, the module structure MS may be provided on the fourth carrier substrate 4000. The module structure MS may be substantially the same as or similar to the module structure MS formed by the fabrication method discussed above with reference to FIGS. 9 to 15. The module structure MS may be disposed in the first opening OP1 in the first connection substrate 200. The module structure MS may be attached to the fourth carrier substrate 4000. In this case, a lower surface of the module structure MS, or the lower surface of the second redistribution substrate 300, may be attached to (an upper surface of) the fourth carrier substrate 4000.

A third molding layer 760 may be formed on the fourth carrier substrate 4000. The third molding layer 760 may at least partially fill a space between the first connection substrate 200 and the module structure MS. For example, a dielectric member may be injected into a space between the first connection substrate 200 and the module structure MS, and then the dielectric member may be cured to form the third molding layer 760. The third molding layer 760 may be on (e.g., cover or overlap) the first connection substrate 200 and the module structure MS. Therefore, the first upper pads 222 of the first connection substrate 200 may not be exposed, and an upper surface of the module structure MS may not be exposed.

Figure 18:
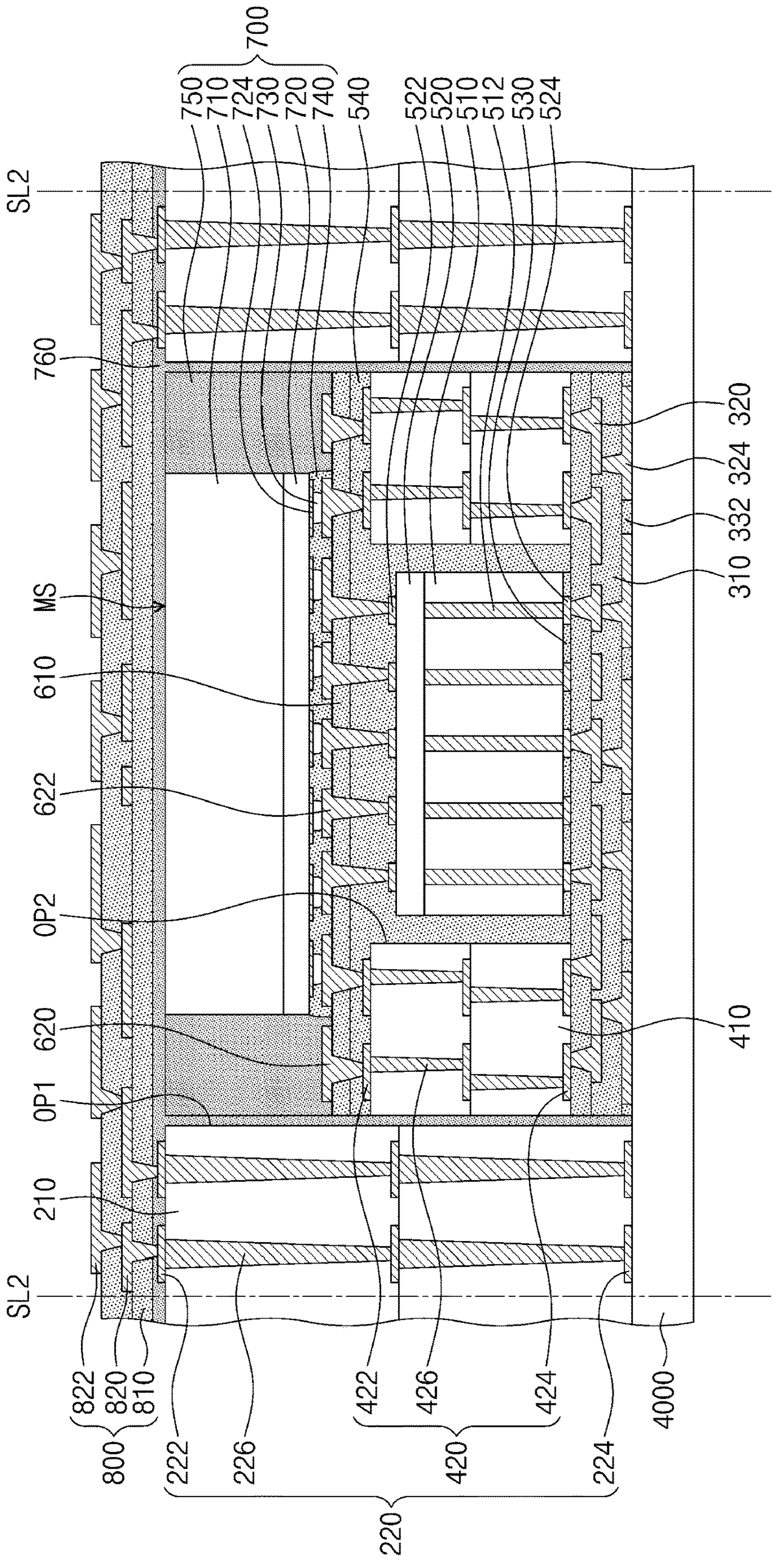

Referring to FIG. 18, a fourth redistribution substrate 800 may be formed on (an upper surface of) the third molding layer 760. For example, a dielectric layer may be formed on the third molding layer 760, and the dielectric layer may be patterned to form a fourth substrate dielectric pattern 810. The dielectric layer may undergo, for example, an etching process that uses a laser to remove a portion of the dielectric layer and a portion of the third molding layer 760. Therefore, through holes may be formed to partially expose upper surfaces of the first upper pads 222. According to some embodiments, the dielectric layer and the third molding layer 760 may be partially removed to form the through holes that partially expose the upper surfaces of the first upper pads 222 and upper surfaces of fourth chip pads 722 provided on the upper surface of the second semiconductor chip 700. The following description will be continuously disclosed with reference to FIG. 18. The through holes may be at least partially filled with a conductive material to form a conductive layer on/in the fourth substrate dielectric pattern 810, and the conductive layer may be patterned to form a fourth substrate wiring pattern 820. Afterwards, the formation of the fourth substrate dielectric pattern 810 and the fourth substrate wiring pattern 820 may be repeatedly performed to form the fourth redistribution substrate 800 having a plurality of fourth substrate wiring layers. Fourth pads 822 may be defined to refer to the fourth substrate wiring pattern 820 provided in an uppermost fourth substrate wiring layer. For example, the fourth pads 822 may be on/at an upper surface of an uppermost fourth substrate dielectric pattern 810.

Figure 19:
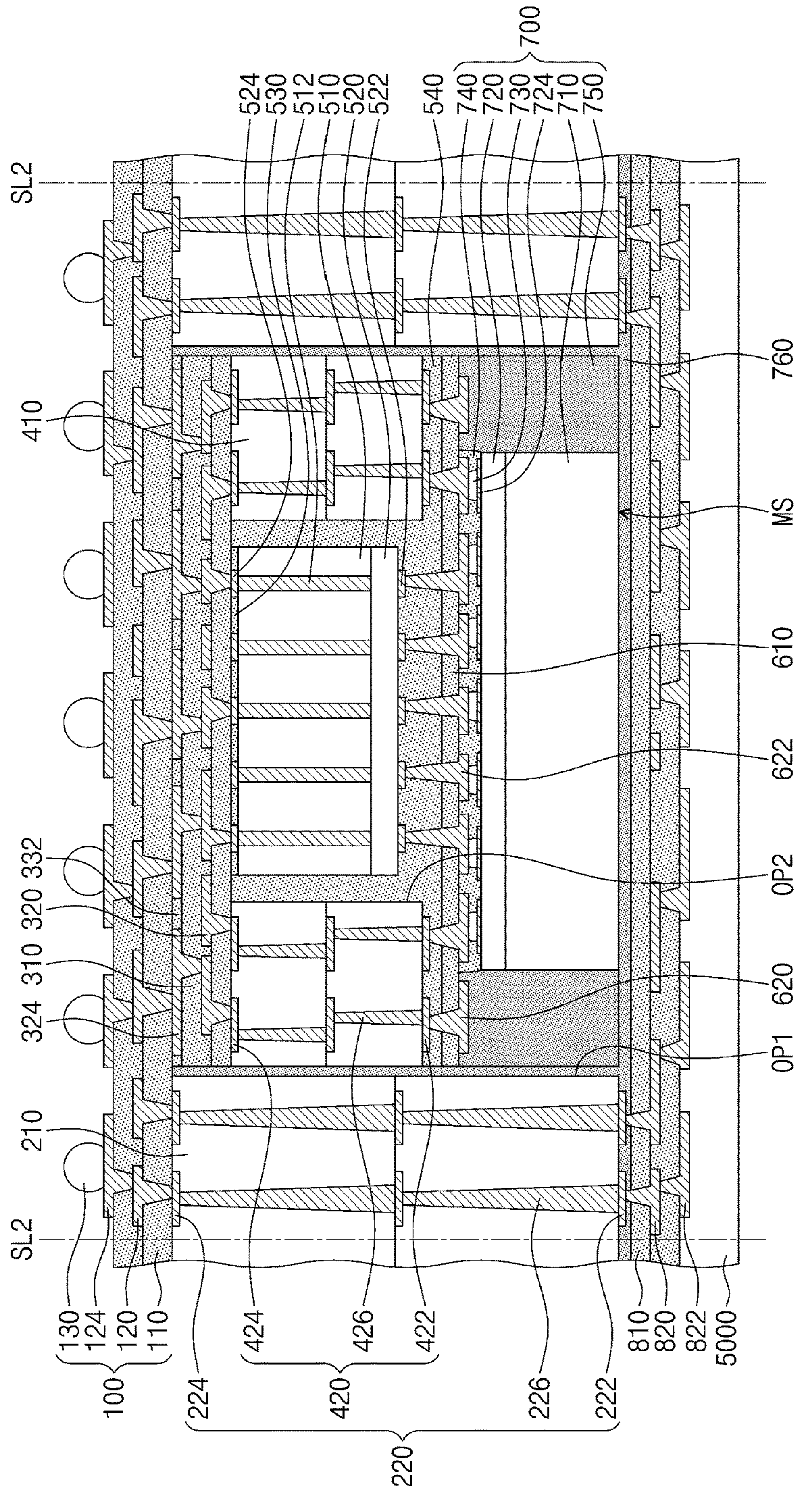

Referring to FIG. 19, a resultant structure of FIG. 18 may be overturned. Thus, the fourth redistribution substrate 800 may be positioned below the module structure MS.

The fourth carrier substrate 4000 may be removed. Thus, the lower surface of the first connection substrate 200 (referring to FIG. 18) may be exposed, and the lower surface of the module structure MS (referring to FIG. 18) may be exposed. For example, the first lower pads 224 of the first connection substrate 200 may be exposed, and second pads 324 of the module structure MS may be exposed.

A fifth carrier substrate 5000 may be provided. The fifth carrier substrate 5000 may be substantially the same as or similar to the first carrier substrate 1000. Although not shown, the fifth carrier substrate 5000 may be attached through a fifth adhesive member to the fourth pads 822 and a lowermost fourth substrate dielectric pattern 810 (referring to FIG. 19).

A first redistribution substrate 100 may be formed on the first connection substrate 200 and the module structure MS. For example, a dielectric layer may be formed on an upper surface of the first connection substrate 200 (referring to FIG. 19) and an upper surface of the module structure MS (referring to FIG. 19), and the dielectric layer may be patterned to form a first substrate dielectric pattern 110. A conductive layer may be formed on/in the first substrate dielectric pattern 110, and the conductive layer may be patterned to form a first substrate wiring pattern 120. The formation of the first substrate dielectric pattern 110 and the first substrate wiring pattern 120 may be repeatedly performed to form the first redistribution substrate 100 having a plurality of first substrate wiring layers. First pads 124 may be defined to refer to the first substrate wiring pattern 120 provided in an uppermost first substrate wiring layer. For example, the first pads 124 may be on/at an upper surface of an uppermost first substrate dielectric pattern 110. After that, a solder ball process may be performed to form external terminals 130 on the first pads 124.

A singulation process, such as sawing, may be employed to form a semiconductor package. The semiconductor package may be substantially the same as or similar to the semiconductor package 10 discussed with reference to FIG. 1. For example, the sawing process may be performed along a second sawing line SL2. The sawing process may cut the third molding layer 760, the first and fourth redistribution substrates 100 and 800, and the first connection substrate 200, and may separate from each other the semiconductor packages in each of which the module structure MS and the first connection substrate 200 are mounted on the first redistribution substrate 100.

In a semiconductor package according to some embodiments of the present inventive concepts, even though a module structure having a large height is provided between redistribution substrates to increase a distance between the redistribution substrates, it may be possible to stably connect the redistribution substrates to each other. Accordingly, the semiconductor package may increase in structural stability.

A module structure according to some embodiments of the present inventive concepts may have a reduced electrical connection length between the redistribution substrates. Accordingly, the semiconductor package may improve in electrical properties.

In addition, no solder ball may be provided between a lower semiconductor chip and the redistribution substrate or between the module structure and the redistribution substrate. Therefore, the semiconductor package according to some embodiments of the present inventive concepts may have a smaller size and increased structural stability.

According to some embodiments of the present inventive concepts, a process for forming a module structure may be performed separately from a subsequent process for forming a connection substrate and a subsequent process for embedding the module structure into the connection substrate, and the process for forming the module structure may be variously changed if necessary. Thus, the module structure may become modularized, and there may be provided a method of fabricating a semiconductor package whose fabrication process is simplified and whose manufacturing cost is reduced.

What is claimed is:

1. A semiconductor package, comprising:
a first redistribution substrate;
a module structure on the first redistribution substrate;
a first molding layer on the first redistribution substrate, wherein the first molding layer extends around at least a portion of the module structure on the first redistribution substrate;
a second redistribution substrate on the module structure and the first molding layer; and
a first vertical connection structure on a side of the module structure, wherein the first vertical connection structure electrically connects the first redistribution substrate and the second redistribution substrate,
wherein the module structure includes:
a third redistribution substrate;
a fourth redistribution substrate on the third redistribution substrate;
a first semiconductor chip between the third redistribution substrate and the fourth redistribution substrate;
a second molding layer between the third redistribution substrate and the fourth redistribution substrate, wherein the second molding layer extends around at least a portion of the first semiconductor chip; and
a second semiconductor chip on the fourth redistribution substrate,
wherein the first semiconductor chip and the second semiconductor chip are electrically connected by a wiring pattern in the fourth redistribution substrate.

2. The semiconductor package of claim 1,
wherein the first vertical connection structure includes a first connection substrate that electrically connects the first redistribution substrate and the second redistribution substrate,
wherein a first opening extends into the first connection substrate,
wherein the module structure is in the first opening, and
wherein the first molding layer is between the first connection substrate and the module structure.

3. The semiconductor package of claim 1,
wherein the module structure further includes a second vertical connection structure on a side of the first semiconductor chip, and
wherein the second vertical connection structure electrically connects the third redistribution substrate and the fourth redistribution substrate.

4. The semiconductor package of claim 3,
wherein the second vertical connection structure includes a second connection substrate that electrically connects the third redistribution substrate and the fourth redistribution substrate,
wherein a second opening extends into the second connection substrate,
wherein the first semiconductor chip is in the second opening, and
wherein the second molding layer is between the second connection substrate and the first semiconductor chip.

5. The semiconductor package of claim 3,
wherein the second vertical connection structure includes a plurality of conductive posts that extend into the second molding layer, and
wherein the third redistribution substrate and the fourth redistribution substrate are electrically connected by the plurality of conductive posts.

6. The semiconductor package of claim 1,
wherein a lower surface of the third redistribution substrate is in direct contact with an upper surface of the first redistribution substrate, and
wherein a wiring pattern in the third redistribution substrate is electrically connected to a wiring pattern in the first redistribution substrate.

7. The semiconductor package of claim 1,
wherein a width of the second semiconductor chip in a horizontal direction parallel with an upper surface of the first redistribution substrate is greater than a width of the first semiconductor chip in the horizontal direction.

8. The semiconductor package of claim 1,
wherein the first semiconductor chip is on an upper surface of the third redistribution substrate,
wherein the first semiconductor chip includes a first active surface,
wherein the first active surface faces a lower surface of the fourth redistribution substrate,
wherein the second semiconductor chip is on an upper surface of the fourth redistribution substrate,
wherein the second semiconductor chip includes a second active surface, and
wherein the second active surface faces the upper surface of the third redistribution substrate.

9. The semiconductor package of claim 1,
wherein a lower surface of the first semiconductor chip is in direct contact with an upper surface of the third redistribution substrate, and
wherein a wiring pattern in the third redistribution substrate is directly connected to first chip pads on the lower surface of the first semiconductor chip.

10. The semiconductor package of claim 1,
wherein the module structure further includes a plurality of first connection terminals between a lower surface of the first semiconductor chip and an upper surface of the third redistribution substrate, and
wherein the first semiconductor chip and the third redistribution substrate are electrically connected by the first connection terminals.

11. The semiconductor package of claim 1,
wherein a plurality of first through vias extend into the first semiconductor chip in a vertical direction perpendicular to an upper surface of the first redistribution substrate, wherein the plurality of first through vias are exposed from a lower surface of the first semiconductor chip, and wherein a wiring pattern in the first redistribution substrate is electrically connected to the plurality of first through vias.

12. The semiconductor package of claim 1, wherein a plurality of second through vias extend into the second semiconductor chip in a vertical direction perpendicular to an upper surface of the first redistribution substrate, wherein the plurality of second through vias are exposed from an upper surface of the second semiconductor chip, and wherein a wiring pattern in the second redistribution substrate is electrically connected to the plurality of second through vias.

13. The semiconductor package of claim 1, further comprising a plurality of second connection terminals between a lower surface of the third redistribution substrate and an upper surface of the first redistribution substrate, wherein the third redistribution substrate and the first redistribution substrate are electrically connected by the plurality of second connection terminals.

14. The semiconductor package of claim 1, further comprising an upper package on the second redistribution substrate.

15. A semiconductor package, comprising:

a first redistribution substrate;

a second redistribution substrate on the first redistribution substrate;

a first connection substrate between the first redistribution substrate and the second redistribution substrate, wherein a first opening extends into the first connection substrate; and a first package in the first opening between the first redistribution substrate and the second redistribution substrate, wherein the first package includes:

a second package;

a first semiconductor chip on the second package; and a first molding layer on the second package, wherein the first molding layer extends around at least a portion of the first semiconductor chip, wherein the second package includes:

a third redistribution substrate;

a fourth redistribution substrate on the third redistribution substrate;

a second connection substrate between the third redistribution substrate and the fourth redistribution substrate, wherein a second opening extends into the second connection substrate; and a second semiconductor chip in the second opening between the third redistribution substrate and the fourth redistribution substrate, wherein a wiring pattern in the first redistribution substrate is directly connected to a wiring pattern in the third redistribution substrate.

16. The semiconductor package of claim 15, wherein a plurality of vias extend into the second semiconductor chip, and wherein the plurality of vias electrically connect the wiring pattern in the third redistribution substrate to a wiring pattern in the fourth redistribution substrate.

17. A semiconductor package, comprising:

a first redistribution substrate;

a first connection substrate on the first redistribution substrate, wherein an opening extends into the first connection substrate;

a module structure in the opening on the first redistribution substrate;

a molding layer on the first redistribution substrate, wherein the molding layer is on the module structure and the first connection substrate and is between the module structure and the first connection substrate;

a plurality of external connections on a lower surface of the first redistribution substrate;

a second redistribution substrate on the molding layer, wherein the second redistribution substrate is electrically connected to the first connection substrate; and an upper package on the second redistribution substrate, wherein the module structure includes:

a third redistribution substrate;

a first semiconductor chip on the third redistribution substrate;

a fourth redistribution substrate on the first semiconductor chip;

a second connection substrate on a side of the first semiconductor chip, wherein the second connection substrate electrically connects the third redistribution substrate to the fourth redistribution substrate; and a second semiconductor chip on the fourth redistribution substrate, wherein a wiring pattern in the fourth redistribution substrate is electrically connected to first pads on an upper surface of the second connection substrate and to second pads on an upper surface of the first semiconductor chip, and wherein a wiring pattern in the third redistribution substrate is electrically connected to third pads on a lower surface of the second connection substrate and to fourth pads on a lower surface of the first semiconductor chip.

18. The semiconductor package of claim 17, wherein a lower surface of the third redistribution substrate is in direct contact with an upper surface of the first redistribution substrate, and wherein the wiring pattern in the third redistribution substrate is electrically connected to a wiring pattern in the first redistribution substrate.

19. The semiconductor package of claim 17, wherein the first semiconductor chip is on an upper surface of the third redistribution substrate, wherein the first semiconductor chip includes a first active surface, wherein the first active surface faces a lower surface of the fourth redistribution substrate, wherein the second semiconductor chip is on an upper surface of the fourth redistribution substrate, wherein the second semiconductor chip includes a second active surface, and wherein the second active surface faces the upper surface of the fourth redistribution substrate.

20. The semiconductor package of claim 17, wherein the lower surface of the first semiconductor chip is in direct contact with an upper surface of the third redistribution substrate, and wherein the wiring pattern in the third redistribution substrate is directly connected to first chip pads on the lower surface of the first semiconductor chip.

* * * * *